(12) United States Patent
Iwasa et al.

(10) Patent No.: US 6,437,052 B1
(45) Date of Patent: *Aug. 20, 2002

(54) MONOMER HAVING DIOL STRUCTURE, POLYMER THEREOF, AND NEGATIVE PHOTORESIST COMPOSITION AND PATTERN FORMING METHOD USING THE SAME

(75) Inventors: Shigeyuki Iwasa; Katsumi Maeda; Etsuo Hasegawa, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/432,130

(22) Filed: Nov. 2, 1999

(30) Foreign Application Priority Data

Nov. 2, 1998 (JP) .......................................... 10-312171
Mar. 30, 1999 (JP) .......................................... 11-087403

(51) Int. Cl.$^7$ .......................... C03F 7/038; C03F 7/004; C08F 8/32
(52) U.S. Cl. .................... 525/375; 430/270.1; 430/170; 430/325; 430/330; 526/284; 526/323; 526/283
(58) Field of Search .............................. 430/270.1, 325, 430/330, 326; 526/284, 323, 283, 320, 329.5; 522/129, 153; 525/374, 375

(56) References Cited

U.S. PATENT DOCUMENTS

| 5,770,346 A | * | 6/1998 | Iwasa et al. | ................ | 430/271 |
| 5,866,304 A | * | 2/1999 | Nakano et al. | ............ | 430/325 |
| 6,030,747 A | * | 2/2000 | Nakano et al. | ......... | 430/270.1 |
| 6,074,801 A | * | 6/2000 | Iwasa et al. | ............ | 430/270.1 |
| 6,106,998 A | * | 8/2000 | Maeda et al. | ............ | 430/280.1 |
| 6,146,806 A | * | 11/2000 | Maeda et al. | ............... | 430/170 |
| 6,248,499 B1 | * | 6/2001 | Maeda et al. | ............ | 430/270.1 |

FOREIGN PATENT DOCUMENTS

| JP | 2-27660 | 6/1990 |
| JP | 6-116254 | 4/1994 |
| JP | 6-214391 | 8/1994 |
| JP | 7-28237 | 1/1995 |
| JP | 7-181678 | 7/1995 |
| JP | 7252324 | 10/1995 |
| JP | 7-295220 | 11/1995 |
| JP | 10-10739 | 1/1998 |
| JP | 2776273 | 5/1998 |
| JP | 10-307400 | 11/1998 |

OTHER PUBLICATIONS

Agnes Olszewski–Ortar et al., "Selective Ring–Opening of ω–Epoxyalkyl (Meth)acrylates. An Efficient Access to Bifunctional Monomers," Tetraheadron Letters, vol. 38, No. 50, pp. 8699–8702, 1997.

L. E. Bogan et al., "Deep UV ANR Photoresists for 248 nm Excimer Laser Photolithography", 1989, SPIE, vol. 1086, pp. 34–45, *Advances in Resist Technology and Processing.*

S. Takechi et al., "Alicyclic Polymer for ArF and KrF Excimer Resist Based on chemical Amplification" 1992, *Journal of Photopolymer Science and Technology*, vol. 5, No. 3, pp. 439–446.

M. Takahashi et al., "Lithographic Characteristics of Alicyclic Polymer Based ArF Single Layer Resists", 1994 *Journal of Photopolymer Science and Technology*, vol. 7, No. 1, pp. 31–38.

R.D. Allen et al., "Resolution and Etch Resistance of a Family of 193 nm Positive Resists", 1995 *Journal of Photopolymer Science and Technology*, vol. 8, No. 4, pp. 623–636.

R.D. Allen et al., "Progress in 193 nm Positive Resists", 1996, *Journal of Photopolymer Science and Technology*, vol. 9, No. 3, pp. 465–474.

K. Maeda et al., "Novel Alkaline–soluble Alicyclic Polymer Poly(TCDMACOOH) For ArF Chemically Amplified Positive Resists", 1996, *Proceeding of SPIE*, vol. 2724, pp. 377–385.

(List continued on next page.)

*Primary Examiner*—David W. Wu
*Assistant Examiner*—Tatyana Zalukaeva
(74) *Attorney, Agent, or Firm*—Young & Thompson

(57) ABSTRACT

Disclosed is a negative photoresist which is suitable for use in photolithography using light of 220 nm or shorter like the light from the ArF excimer laser as exposure light, avoids pattern deformation originated from swelling and has a high adhesion strength to the substrate (a micro pattern is hard to be separated from the substrate) in addition to a dry etching resistance and high resolution. A negative photoresist composition contains a polymer having a diol structure having a repeating unit represented by a following formula (6), a crosslinking agent comprised of a compound containing a functional group represented by a following formula (12) and a photoacid generator which generates acid by exposure:

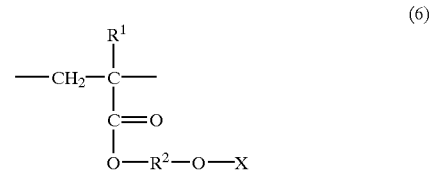

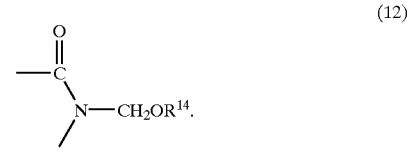

32 Claims, 1 Drawing Sheet

OTHER PUBLICATIONS

S. Iwasa et al., "Novel Negative Photoresist Based on Polar Alicyclic Polymers for ArF Excimer Laser Lithography", 1998, *Proceeding of SPIE*, vol. 3333, pp. 417–424.

J. V. Crivello et al., *"Journal of the Organic Chemistry"*, 1978, vol. 43, No. 15, pp. 3055–3058.

J. V. Crivello et al., "New Photoinitiators for Cationic Polymerization", 1976, *Journal of the Polymer Science*, vol. 56, pp. 383–395.

O. Nalamasu et al., "Development of a Chemically Amplified Positive (CAMP) Resist Material for Single–Layer Deep–UV Lithography", 1990, *Proceeding of SPIE*, vol. 1262, pp. 32–48.

T. Ueno et al., "Chemical Amplification Positive Resist Systems Using Novel Sulfonates as Acid Generators", 1990, *Proceeding of PME '89*, Kodansya, pp. 413–424.

* cited by examiner

MONOMER HAVING DIOL STRUCTURE, POLYMER THEREOF, AND NEGATIVE PHOTORESIST COMPOSITION AND PATTERN FORMING METHOD USING THE SAME

BACKGROUND OF THE INVENTION

1. Field of the Invention

The present invention relates to a monomer having a diol structure, a polymer thereof, and a negative photoresist composition and a pattern forming method using the same. More particularly, this invention relates to a monomer suitable as a material for a resist which is used in photolithography in fabrication of various kinds of semiconductor devices using deep ultraviolet rays of 220 nm or shorter, particularly, light from an ArF excimer laser, as exposure light, a polymer thereof, and a negative photoresist composition and a pattern forming method using the same.

2. Description of the Related Art

Higher density and higher integration have been pursued for various kinds of typical semiconductor devices which require micro processing of a half micron order. This leads to an ever growing demand for the photolithography technology to form micro circuit patterns.

One way of achieving micro patterns is to shorten the wavelength of exposure light which is used in forming a pattern using a photoresist. Therefore, a consideration has been given to the use of an KrF excimer laser having a shorter wavelength (=248 nm) in place of i rays (wavelength=365 nm) which have been used so far as the exposure light source in the mass production of DRAMs of 256 Mbits (processing size of 0.25 micrometers or smaller). Further, the fabrication of DRAMs having an integration scale of 1 Gbits (processing size of 0.18 micrometers or smaller) or greater which demands a finer processing technique needs a light source of a shorter length. For this purpose, the use of photolithography using an ArF excimer laser (193 nm) is under consideration.

Photolithography using an excimer laser requires an improvement on the cost performance of the laser because the service life of the gas that is the raw material to cause laser oscillation is short and the laser device itself is expensive. In view of the above, there are increasing demands for higher sensitivity as well as for higher resolution which matches the microminiaturized processing size.

A chemical sensitization resist which uses a photoacid generator as a photosensitive agent is well known as a highly-sensitive photoresist. The feature of the chemical sensitization resist lies in that a protonic acid produced from the photoacid generator containing in the resist by irradiation of light causes an acid catalytic reaction with the base resin or the like of the resist in a heat treatment after exposure. This chemical sensitization resist has achieved an extremely high sensitivity as compared with the conventional resist that has a photoreaction efficiency (reaction per photon) of less than 1. A typical example of the chemical sensitization resist is a positive resist described in Examined Japanese Patent Application KOKOKU Publication No. H2-27660, which consists of a combination of triphenylsulfonium hexafluoroarsenate and poly(p-tert-butoxycarboxy-α-methylstyrene). As a negative photoresist, a resist consisting of a combination of polyvinylphenol and a melamine derivative disclosed in Proceeding of SPIE, vol. 1086, pp. 34–45 (1989) by L. E. Bogan et al.

Resins having a benzene ring, such as novolak and polyvinylphenol have been used for resists for the g rays, i rays and KrF excimer laser. But, resins having a benzene ring show a significant high light absorption with respect to light having a wavelength of 220 nm or shorter, such as the light from the ArF excimer laser. If those resists are used in photolithography using the ArF excimer laser, most of the exposure light is absorbed by the surface of the thin film so that the exposure light does not reach the substrate. This disables the formation of a fine resist pattern. The resins that have been used for resists for g rays, i rays and the KrF excimer laser cannot be adapted for use in photolithography using light with a short wavelength of 220 nm or shorter. With regard to the resists for the g rays, i rays and KrF excimer laser, however, the dry etching resistance that is essential for resists for manufacturing semiconductors are actually acquired from the benzene ring in each resin so that it is not good enough to simply use the benzene ring. That is, resists for exposure with the ArF excimer laser should have an etching resistance without containing a benzene ring and be transparent with respect to the wavelength of 220 nm or shorter.

Active studies are being made on positive resists which have a high transparency to the ArF excimer laser light (193 nm) and have a dry etching resistance. Resins having an alicyclic hydrocarbon group are used as the base resin in those resists. Typical examples include a copolymer having a unit of adamantylmethacrylate (Journal of Photopolymer Science and Technology, vol. 5 (no. 3), pp. 439–446 (1992) by Takechi et al.), a copolymer consisting of adamantylmethacrylate and oxocyclomethacrylate (Journal of Photopolymer Science and Technology, vol. 7, p. 31 (1994) by Takahashi et al.), a copolymer having a unit of isobornylmethacrylate (Journal of Photopolymer Science and Technology, vol. 8 (no. 4), pp. 623–636 (1995) and vol. 9 (no. 3), pp. 465–474 (1996) by R. D. Allen et al.), and a copolymer having a unit of carboxylated tricyclodecylmethylmethacrylate (Proceeding of SPIE, vol. 2724, pp. 377–385 (1996).

On the other hand, very few studies have been made on negative photoresists for exposure by the ArF excimer laser. The only negative photoresist that provides a high resolution is the negative photoresist consisting of a combination of poly(carboxytetracyclododecylacrylate-hydroxytricyclodecylacrylate), tetrakis(methoxymethyl)glycoluril and triphenylsulfoniumtriflate proposed by the present inventors. Proceeding of SPIE, vol. 3333, pp. 417–424 (1998) describes this resist having a resolution of 0.18 micrometers.

In resins which use alicyclic (meth)acrylate having a hydroxyl group like hydroxytricyclodecylacrylate, the hydroxyl group has both an effect of improving the adhesion to the substrate and a reactivity to a crosslinking agent like tetrakis(methoxymethyl)glycoluril. Therefore, alicyclic (meth)acrylate having a hydroxyl group can be used as the base resin for a negative photoresist without copolymerization of norbornene and maleic anhydride disclosed in Unexamined Japanese Patent Application KOKAI Publication No. H110-10739.

Hydroxytricyclo[5.2.1.0$^{2,6}$]decyl(meth)acrylate disclosed in Japanese Patent No. 2776273, and tricyclodecandimethanolmonoacrylate disclosed in Unexamined Japanese Patent Application KOKAI Publication No. H10-307400 are known as alicyclic (meth)acrylate having a hydroxyl group.

If such negative photoresists have an insufficient crosslinking density, they are apt to be swelled in a developer, resulting in pattern deformation, or stripping of the obtained patterns is likely to occur due to insufficient adhesion.

SUMMARY OF THE INVENTION

Accordingly, it is an object of the present invention to provide a negative photoresist which is suitable for use in photolithography using light of 220 nm or shorter like the light from the ArF excimer laser as exposure light, avoids pattern deformation originated from swelling and has a high adhesion strength to the substrate (a micro pattern is hard to be stripped from the substrate) in addition to a dry etching resistance and high resolution.

To achieve the above object, the present inventors have made extensive studies and found that the object could be achieved by a monomer having a diol structure, a polymer thereof, a negative photoresist composition and a pattern forming method using the same.

A monomer according to the first aspect of this invention has a diol structure represented by a following formula (1):

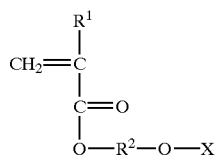
(1)

where $R^1$ is a hydrogen atom or methyl group, $R^2$ is a $C_2$–$C_6$ alkylene group and X is an alicyclic alkyl group having a diol structure.

X in the formula (1) is an alicyclic alkyl group having a diol structure represented by a following formula (2), (3), (4) or (5):

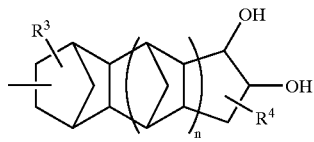
(2)

where n is an integer from 0 to 3, $R^3$ and $R^4$ are a hydrogen atom or methyl group,

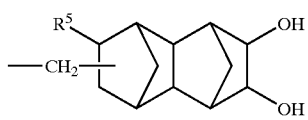
(3)

where $R^5$ is a hydrogen atom or methyl group,

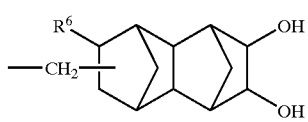
(4)

where $R^6$ is a hydrogen atom or methyl group, or

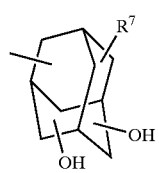
(5)

where $R^7$ is a hydrogen atom or methyl group.

A polymer according to the second aspect of this invention has a diol structure having a repeating unit represented by a following formula (6):

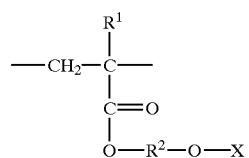
(6)

where $R^1$ is a hydrogen atom or methyl group, $R^2$ is a $C_2$–$C_6$ alkylene group and X is an alicyclic alkyl group having a diol structure.

X in the formula (6) is an alicyclic alkyl group having a diol structure represented by a following formula (7), (8), (9) or (10):

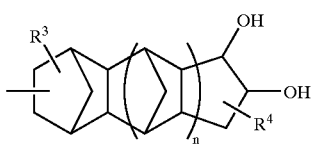
(7)

where n is an integer from 0 to 3, $R^3$ and $R^4$ are a hydrogen atom or methyl group,

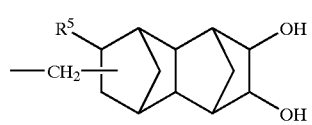
(8)

where $R^5$ is a hydrogen atom or methyl group,

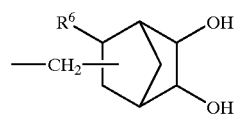
(9)

where $R^6$ is a hydrogen atom or methyl group, or

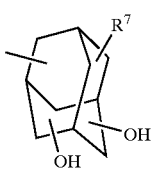
(10)

where $R^7$ is a hydrogen atom or methyl group.

It is desirable that the polymer has a diol structure represented by a following formula (11) and a weight average molecular weight of 1,000 to 50,000:

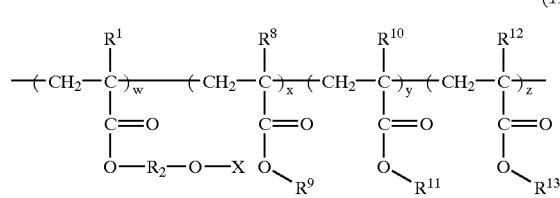
(11)

where $R^1$ and $R^2$ are the same as those in the formula (6), X is the same as that in any of the formulae (6) to (10), $R^8$ is a hydrogen atom or methyl group, is a $C_7$–$C_{18}$ crosslinked cyclic hydrocarbon group having a carboxyl group, $R^{10}$ is a hydrogen atom or methyl group, $R^{11}$ is a $C_7$–$C_{13}$ hydrocarbon group having a hydroxyl group, $R^{12}$ is a hydrogen atom or methyl group, $R^{13}$ is a hydrogen atom or a $C_1$–$C_{12}$ hydrocarbon group having a hydroxyl group, and w, x, y and z are arbitrary values satisfying w+x+y+z=1, $0<w\leq1$, $0\leq x<1$, $0\leq y<1$ and $0\leq z<1$.

A negative photoresist composition according to the third aspect of this invention contains a polymer having a diol structure according to the second aspect of this invention, a crosslinking agent comprised of a compound containing a functional group represented by a following formula (12) and a photoacid generator which generates acid by exposure:

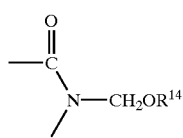
(12)

where $R^{14}$ is a hydrogen atom, a $C_1$–$C_6$ alkyl group or a $C_3$–$C_6$ oxoalkyl group.

The negative photoresist composition may further contain a polyhydric alcohol compound.

The crosslinking agent may be comprised of at least one of compounds represented by following formulae (13) to (17):

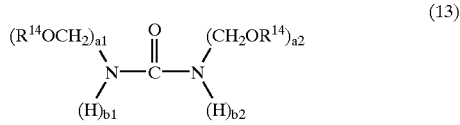
(13)

where $R^{14}$ is the same as that in the formula (12), $a_1$ is 1 or 2, $a_2$ is 1 or 2, $b_1$ is 0 or 1, $b_2$ is 0 or 1, $a_1+b_1=2$ and $a_2+b_2=2$,

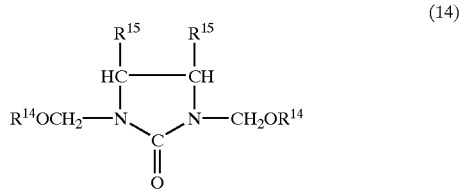
(14)

where $R^{14}$ is the same as that in the formula (12), $R^{15}$ is a hydrogen atom, a hydroxyl group, a $C_1$–$C_6$ alkoxy group or a $C_3$–$C_6$ oxoalkyloxy group,

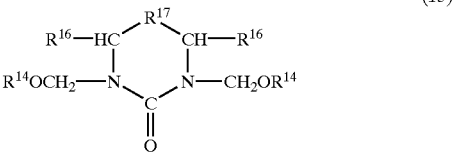
(15)

where $R^{14}$ is the same as that in the formula (12), $R^{16}$ is a hydrogen atom, a hydroxyl group, a $C_1$–$C_6$ alkoxy group or a $C_3$–$C_6$ oxoalkyloxy group, and $R^{17}$ is an oxygen atom, a sulfur atom, a $C_1$–$C_3$ alkylene group or a hydroxymethylene group,

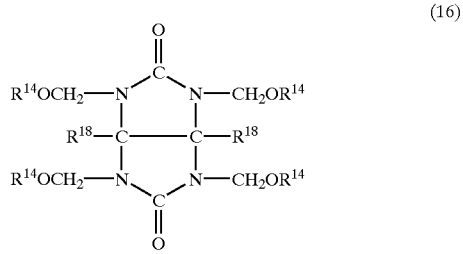
(16)

where $R^{14}$ is the same as that in the formula (12), $R^{18}$ is a hydrogen atom or a methyl group, and

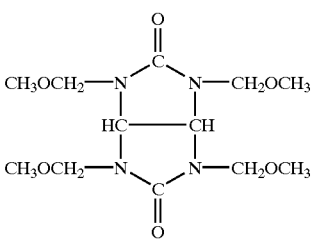
(17)

The photoacid generator may be comprised of at least one of a sulfonium salt compound represented by a following formula (18), an iodonium salt compound represented by a following formula (20), an imide compound represented by a following formula (21) and a diazo compound represented by a following formula (22):

(18)

where $R^{19}$, $R^{20}$ and $R^{21}$ are independently an alkyl-substituted, halogen-substituted or unsubstituted aromatic group, an alicyclic alkyl group, a crosslinked cyclic hydrocarbon group, a 2-oxoalicyclic alkyl group or an alkyl group, $Y^-$ is $BF_4^-$, $AsF_6^-$, $SbF_6^-$ or an ion represented by a following formula (19),

(19)

where Z is $C_nF_{2n+1}$ (n is an integer from 1 to 6), an alkyl group or an alkyl-substituted, halogen-substituted or unsubstituted aromatic group,

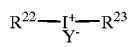

(20)

where $R^{22}$ and $R^{23}$ are independently an alkyl-substituted, halogen-substituted or unsubstituted aromatic group, an alicyclic alkyl group, a crosslinked cyclic hydrocarbon group, a 2-oxoalicyclic alkyl group or an alkyl group, and $Y^-$ is the same as that in the formula (18),

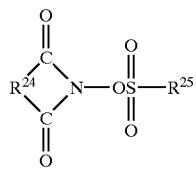

(21)

where $R^{24}$ is a halogen-substituted or unsubstituted alkylene group, an alkyl-substituted, halogen-substituted or unsubstituted dihydric aromatic group, and $R^{25}$ is a halogen-substituted or unsubstituted alkyl group, an alkyl group or a halogen-substituted or unsubstituted aromatic group, and

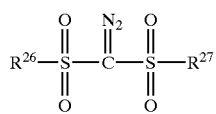

(22)

where $R^{26}$ and $R^{27}$ are independently a halogen-substituted or unsubstituted alkyl group, a halogen-substituted or unsubstituted aromatic group or an alicyclic hydrocarbon group.

It is desirable that the negative photoresist composition contains 50 to 98 parts by weight of the polymer, 1 to 50 parts by weight of the crosslinking agent and 0.2 to 15 parts by weight of the photoacid generator.

A resist pattern forming method according to the fourth aspect of this invention comprises a step of applying a negative photoresist composition as recited in claim 7 onto a substrate to be processed; a step of exposing the negative photoresist composition with light having a wavelength of 180 to 220 nm; a baking step; and a developing step.

ArF excimer laser light may be used as the light having a wavelength of 180 to 220 nm.

DETAILED DESCRIPTION OF THE PREFERRED EMBODIMENT

Figure 1A:
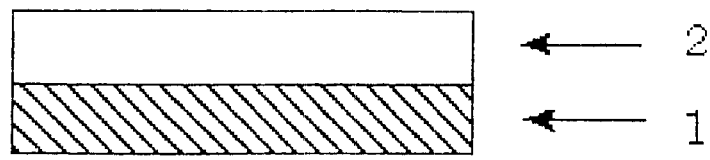
FIGS. 1A to 1D are explanatory diagrams illustrating a resist pattern forming method according to this invention.

Preferred embodiments of the present invention will now be described specifically.

1. A Monomer Having a Diol Structure

A monomer according to this invention has a diol structure represented by the formula (1). In the formula (1), X is an alicyclic alkyl group having a diol structure. Examples of the alicyclic alkyl group having a diol structure include alicyclic alkyl groups respectively represented by the formulae (2), (3), (4) and (5).

More specifically, they include a 3,4-dihydroxytricyclo [5.2.1.0$^{2,6}$]decyl group, 3,4-dihydroxy-dimethyltricyclo [5.2.1.0$^{2,6}$]decyl group, 3,4-dihydroxytetracyclo[4.4.0.1$^{2,5}$.1$^{7,10}$]dodecylmethyl group, 3,4-dihydroxy-8-methyl-tetracyclo[4.4.0.1$^{2,5}$.1$^{7,10}$]dodecylmethyl group and dihydroxyadamantyl group, which are given in Table 1, dihydroxyisobornyl group and dihydroxyisobornyl group.

TABLE 1

| X | chemical structure of group |
|---|---|
| 3,4-dihydroxytricyclo [5.2.1.0$^{2,6}$] decyl group | |
| 3,4-dihydroxy-dimethyltricyclo [5.2.1.0$^{2,6}$] decyl group | |
| 3,4-dihydroxytetracyclo [4.4.0.1$^{2,5}$.1$^{7,10}$]-dodecylmethyl group | |
| 3,4-dihydroxy-8-methyl-tetracyclo [4.4.0.1$^{2,5}$.1$^{7,10}$]-dodecylmethyl group | |
| 3,4-dihydroxy-8-methyl-tetracyclo [4.4.0.1$^{2,5}$.1$^{7,10}$]-dodecylmethyl group | |
| 3,4-dihydroxy-8-methyl-tetracyclo [4.4.0.1$^{2,5}$.1$^{7,10}$]-dodecylmethyl group | |
| dihydroxyadamantyl group | |

A monomer according to this invention, e.g., an alicyclic (meth)acrylate derivative having a diol structure, can be synthesized as follows. An alicyclic (meth)acrylate having an unsaturated bond represented by the following formula (23) is subjected to epoxidation with a peroxide like m-chloroperbenzoic acid to yield alicyclic epoxy(meth)acrylate represented by the following formula (24), then ring opening of an epoxy group is carried out with perchloric acid, thereby yielding the alicyclic (meth)acrylate derivative.

The alicyclic (meth)acrylate used here that is represented by the formula (24) can be acquired by the reaction of alicyclic alcohol represented by the following formula (25) with (meth)acryloyl chloride using an alkaline catalyst like tertiary amine. It can also be acquired by the reaction of alicyclic alcohol represented by the following formula (25) with (meth)acrylate using an acidic catalyst like trifluoroacetic acid.

(23)

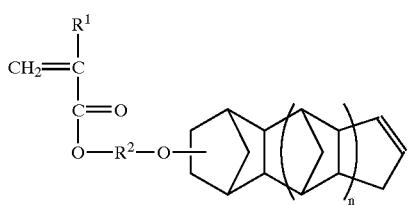

where $R^1$ is a hydrogen atom or methyl group, $R^2$ is a $C_2$–$C_6$ alkylene chain and n is an integer from 0 to 3.

(24)

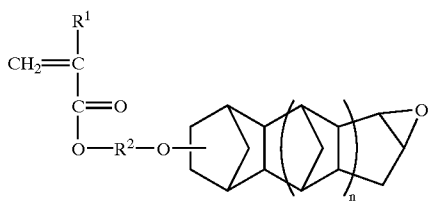

where $R^1$ is a hydrogen atom or methyl group, $R^2$ is a $C_2$–$C_6$ alkylene chain and n is an integer from 0 to 3.

(25)

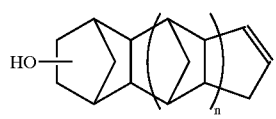

where n is an integer from 0 to 3.

2. A Polymer Having a Diol Structure

A polymer according to this invention has a diol structure having a repeating unit represented by the formula (6).

The polymer according to this invention can be acquired by polymerization of the aforementioned monomer using an adequate radical polymerization initiator.

Specifically, this polymer can be acquired by adding a radical polymerization initiator like azobisisobutyro-nitrile or benzoyl peroxide into a solvent such as tetrahydrofuran under the inert gas (argon, nitrogen or the like) atmosphere and heating and stirring the resultant product at 50 to 70 degrees Celsius for 5 to 12 hours.

A specific example of the polymer according to this invention is a polymer which has a diol structure represented by the formula (11) and a weight average molecular weight of 1,000 to 50,000.

In the formula (11), $R^9$ may specifically be a carboxytricyclo[$5.2.1.0^{2,6}$]decylmethyl group, carboxytricyclo[$5.2.1.0^{2,6}$]decyl group, carboxyadamantyl group, carboxynorbornyl group, carboxymethylnorbornyl group, carboxyisobornyl group, carboxytetracyclo[$4.4.0.1^{2,5}.1^{7,10}$]-dodecyl group, carboxymethyltetracyclo[$4.4.0.1^{2,5}.1^{7,10}$]-dodecyl group, which are given in Table 2, or the like, but is in no way limited to those groups.

Unexposed negative photoresist should be dissolved into a developer to be patterned, and an alicyclic group having a carboxyl group works to increase the dissolving speed to the developer for a negative photoresist. Crosslinked cyclic hydrocarbon works to improve the dry etching resistance.

TABLE 2

| $R^9$ | chemical structure of group |
|---|---|
| carboxytricyclo [$5.2.1.0^{2,6}$] decylmethyl group | ![structure]—COOH<br>or<br>![structure]—COOH |
| carboxytricyclo [$5.2.1.0^{2,6}$] decyl group | ![structure]—COOH<br>or<br>![structure]—COOH |
| carboxyadamantyl group | ![structure]—COOH |
| carboxynorbornyl group | ![structure]—COOH |
| carboxymethylnorbornyl group | ![structure]—$CH_3$, COOH |
| carboxyisobornyl group | $CH_3$, $CH_3$, $CH_3$ ![structure] COOH |
| carboxytetracyclo [$4.4.0.1^{2,5}.1^{7,10}$] dodecyl group | ![structure]—COOH |
| carboxymethyltetracyclo [$4.4.0.1^{2,5}.1^{7,10}$] dodecyl group | ![structure]—$CH_3$, COOH |

$R^{11}$ may specifically be a hydroxyethyl group, hydroxypropyl group, hydroxybutyl group, hydroxycyclohexyl group, hydroxydimethylcyclohexyl group, hydroxytricyclo-[$5.2.1.0^{2,6}$]decyl group, hydroxyadamantyl group, hydroxynorbornyl group, hydroxyisobornyl group, hydroxytetracyclo[$4.4.0.1^{2,5}.1^{7,10}$]dodecyl group or the like, but is not limited to those groups.

$R^{13}$ may specifically be any of a methyl group, ethyl group, n-propyl group, isopropyl group, n-butyl group, isobutyl group, t-butyl group, cyclohexyl group, dimethylcyclohexyl group, tricyclo[$5.2.1.0^{2,6}$]decyl group, adamantyl group, norbornyl group, isobornyl group, tetracyclo[$4.4.0.1^{2,5}.1^{7,10}$]dodecyl group or the like, but is not limited to those groups.

The polymer represented by the formula (11) can be obtained by polymerization of a monomer using a proper radical polymerization initiator. Specifically, this polymer can be acquired by adding a radical polymerization initiator like azobisisobutyronitrile or benzoyl peroxide into a solvent such as tetrahydrofuran under the inert gas (argon, nitrogen or the like) atmosphere and heating and stirring the resultant product at 50 to 70 degrees Celsius for 5 to 12 hours. A polymer having an arbitrary copolymerization ratio by selecting the polymerization conditions such as the content ratio of the monomer. The weight average molecular weight of this polymer is preferably 1,000 to 500,000, and is more preferably 3,000 to 200,000. A polymer with a weight average molecular weight of less than 1,000 has a low glass transition point and may become hard to be treated as a resist, while a polymer with a weight average molecular weight of over 500,000 may have a difficulty in providing a uniform film on the substrate.

3. Negative Photoresist Composition

A negative photoresist composition according to this invention contains the aforementioned polymer, a crosslinking agent, a photoacid generator and, as needed, a polyhydric alcohol compound.

A possible crosslinking agent is a compound containing a group represented by the formula (12). A compound containing a functional group represented by the formula (12) has such a property as to be reacted with a hydroxyl group in the manner shown by the following reaction formula (A) under the presence of an acidic catalyst. That is, a polymer having a hydroxyl group is crosslinked with a compound containing a functional group represented by the formula (12) under the presence of an acidic catalyst. If this polymer is dissolvable in a developer, this crosslinking makes the polymer undissolvable in a developer.

The negative photoresist composition according to this invention contains a polymer having an alicyclic alkyl group with a diol structure having two hydroxyl groups in a repeating unit. That is, the polymer in the negative photoresist according to this invention has many reaction points to a crosslinking agent as compared with known polymers having a monool.

Further, an alicyclic alkyl hydroxide group (X in the general formula (6)) in the polymer in the negative photoresist of this invention has an alkylene chain ($R^2$ in the general formula (6)) between the alicyclic alkyl group and the principal chain of the polymer, the degree of freedom of the resist film is relatively large. This enhances the reactivity to a crosslinking agent. In other words, since the polymer in the negative photoresist according to this invention has many reaction points to a crosslinking agent and a high reactivity to a crosslinking agent, it can provide a high crosslinking density.

When a polymer containing a group having a diol structure is used in a negative photoresist, pattern deformation originated from insufficient crosslinking is hard to occur. As a polymer containing a group having a diol structure has two polar groups which work to improve the adhesion to the substrate, the resist pattern formed will not be separated easily from the substrate.

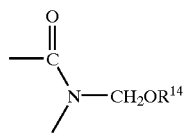

where $R^{14}$ is a hydrogen atom, a $C_1$–$C_6$ alkyl group or a $C_3$–$C_6$ oxoalkyl group.

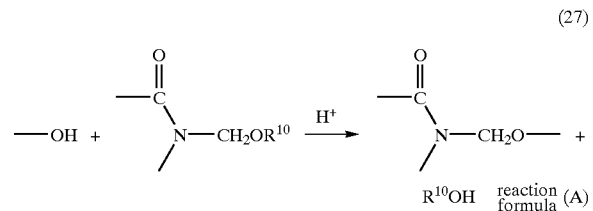

Compounds containing a group represented by the formula (26) may include compounds represented by a formula (17) and the following formula (28).

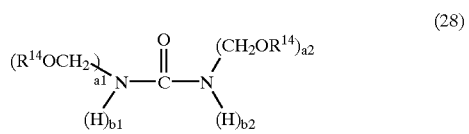

where $R^{14}$ is a hydrogen atom, a $C_1$–$C_6$ alkyl group (which specifically is a methyl group, ethyl group, propyl group, isopropyl group, butyl group, isobutyl group, tertiary butyl group, pentyl group, hexyl group or the like, but is not limited to those groups) or a $C_3$–$C_6$ oxoalkyl group (which specifically is a β-oxopropyl group, β-oxobutyl group, β-oxoheptyl group, β-oxohexyl group or the like, but is not limited to those groups), $a_1$ is 1 or 2, $a_2$ is 1 or 2, $b_1$ is 0 or 1, $b_2$ is 0 or 1, $a_1+b_1=2$ and $a_2+b_2=2$.

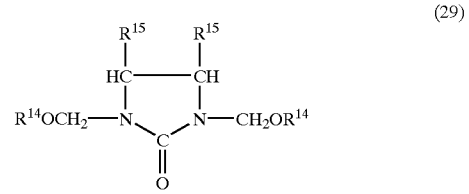

where $R^{14}$ is the same as that in the formula (28), $R^{15}$ is a hydrogen atom, a hydroxyl group, a $C_1$–$C_6$ alkoxy group (which specifically is a methoxy group, ethoxy group, propoxy group, isopropoxy group, butoxy group, isobutoxy group, tertiary butoxy group, pentyloxy group, hexyloxy group or the like, but is not limited to those groups) or a $C_3$–$C_6$ oxoalkyloxy group (which specifically is a β-oxopropoxy group, β-oxobutoxy group, β-oxoheptyloxy group, β-oxohexyloxy group or the like, but is not limited to those groups).

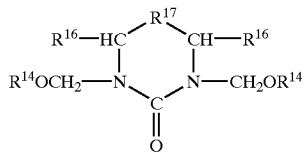

(30)

where $R^{14}$ is the same as that in the formula (28) and $R^{17}$ is an oxygen atom, a sulfur atom, a $C_1$–$C_3$ alkylene group (which specifically is a methylene group, ethylene group, propylene group, 1-methylethylene group or the like, but is not limited to those groups) or a hydroxymethylene group,

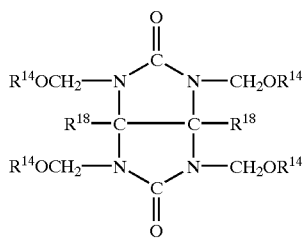

(31)

where $R^{14}$ is the same as that in the formula (28), $R^{18}$ is a hydrogen atom, a methyl group or an ethyl group.

In the compounds containing a group shown by the formula (26) which is a crosslinking agent in the negative photoresist composition of the invention, methylolurea in which $R^{14}$ is a hydrogen atom, for example, can be synthesized by methylolation of urea with formaldehyde.

The compounds represented by the formula (28) where $R^{14}$ is an alkyl group or oxoalkyl group can be obtained by processing methylolurea with the corresponding alcohol. For example, processing methylolurea with methanol can yield dimethylated methylolurea [in the formula (28), $R^{14}$ is a methyl group ($C_1$ alkyl group)], processing it with ethanol can yield diethylated methylolurea [in the formula (28), $R^{14}$ is an ethyl group ($C_2$ alkyl group)], processing it with isobutanol can yield diisobutylated methylolurea [in the formula (28), $R^{14}$ is an isobutyl group ($C_4$ alkyl group)], and processing it with 2-oxopropanol (also called "hydroxyacetone") can yield di-β-oxopropylated methylolurea [in the formula (28), $R^{14}$ is a β-oxopropyl group ($C_3$ oxoalkyl group)].

In the compounds represented by the formula (29), for example, 1,3-bis(hydroxymethyl)ethyleneurea (also called "1,3-dimethylolimidazolidone-2") in which $R^{14}$ in the formula (29) is a hydrogen atom and $R^{15}$ is a hydrogen atom can be obtained by the reaction of urea with ethylenediamine and formaldehyde.

The compounds represented by the formula (29) where $R^{14}$ is an alkyl group or oxoalkyl group and $R^{15}$ is a hydrogen atom can be obtained by processing 1,3-bis(hydroxymethyl)-ethyleneurea with the corresponding alcohol. For example, processing 1,3-bis(hydroxymethyl) ethyleneurea with methanol can yield 1,3-bis (methoxymethyl)ethyleneurea [in the formula (29), $R^{14}$ is a methyl group ($C_1$ alkyl group) and $R^{15}$ is a hydrogen atom], processing it with ethanol can yield 1,3-bis(ethoxymethyl) ethyleneurea [in the formula (29), $R^{14}$ is an ethyl group ($C_2$ alkyl group) and $R^{15}$ is a hydrogen atom], processing it with isobutanol can yield 1,3-bis-(isobutoxymethyl)ethyleneurea [in the formula (29), $R^{14}$ is an isobutyl group ($C_4$ alkyl group) and $R^{15}$ is a hydrogen atom], and processing it with 2-oxopropanol (also called "hydroxyacetone") can yield 1,3-bis(β-oxopropoxymethyl)-ethyleneurea [in the formula (29), $R^{14}$ is a 2-oxopropyl group ($C_3$ oxoalkyl group) and $R^{15}$ is a hydrogen atom].

1,3-bis(hydroxymethyl)-4,5-bis(hydroxy)ethyleneurea (also called "1,3-dimethylol-4,5-dihydroxyimidazolidone-2") in which $R^{14}$ in the formula (29) is a hydrogen atom and $R^{15}$ is a hydroxyl group can be obtained by the reaction of urea with glyoxal and then by performing methylolation using formaldehyde.

The compounds in the formula (29) where $R^{14}$ is an alkyl group or oxoalkyl group and $R^{15}$ is an alkoxy group or oxoalkoxy group can be obtained by processing 1,3-bis (hydroxymethyl)-4,5-bis(hydroxy)ethyleneurea with the associated alcohol. For example, processing 1,3-bis-(hydroxymethyl)4,5-bis(hydroxy)ethyleneurea with methanol can yield 1,3-bis(methoxymethyl)4,5-bis(methoxy)-ethyleneurea [in the formula (29), $R^{14}$ is a methyl group ($C_1$ alkyl group) and $R^{15}$ is a methoxy group ($C_1$ alkoxy group)], processing it with ethanol can yield 1,3-bis-(ethoxymethyl) 4,5-bis(ethoxy)ethyleneurea [in the formula (29), $R^{14}$ is an ethyl group ($C_2$ alkyl group) and $R^{15}$ is an ethoxy group ($C_2$ alkoxy group)], processing it with isopropanol can yield 1,3-bis(isopropoxymethyl)-4,5-bis(isopropoxy) ethyleneurea [in the formula (29), $R^{14}$ is an isopropyl group ($C_3$ alkyl group) and $R^{15}$ is a propyloxy group ($C_3$ alkoxy group)], processing it with tertiary butanol can yield 1,3-bis (tertiary butoxymethyl)-4,5-bis(tertiary butoxy) ethyleneurea [in the formula (29), $R^{14}$ is a tertiary butyl group ($C_4$ alkyl group) and $R^{15}$ is a tertiary butoxy group ($C_4$ alkoxy group)], and processing it with 2-oxopropanol (also called "hydroxyacetone") can yield 1,3-bis(β-oxopropoxymethyl)-4,5-bis(β-oxopropoxy)-ethyleneurea [in the formula (29), $R^{14}$ is a β-oxopropyl group ($C_3$ oxoalkyl group) and $R^{15}$ is a β-oxopropyroxy group ($C_3$ oxoalkoxy group)].

In the compounds represented by the formula (30), for example, 1,3-bis(hydroxymethyl)-tetrahydro-2(1H)-pyrimidinone where $R^{14}$ and $R^{16}$ in the formula (30) are hydrogen atoms and $R^{17}$ is a methylene group can be obtained by the reaction of urea with propyrenediamine and then the reaction of the resultant product with formaldehyde.

When $R^{14}$ is an alkyl group, $R^{16}$ is a hydrogen atom and $R^{17}$ is a methylene group in the formula (30), the compound can be obtained by processing 1,3-bis(hydroxymethyl)-tetrahydro-2(1H)pyrimidinone with the corresponding alcohol. For example, processing 1,3-bis(hydroxymethyl)-tetrahydro-2(1H)pyrimidinone with methanol can yield dimethylated 1,3-bis(hydroxymethyl)-tetrahydro- 2(1H) pyrimidinone [in the formula (30), $R^{14}$ is a methyl group ($C_2$ alkyl group), $R^{16}$ is a hydrogen atom and $R^{17}$ is a methylene group ($C_1$ alkylene group)], processing it with ethanol can yield diethylated 1,3-bis(hydroxymethyl)-tetrahydro-2(1H) pyrimidinone [in the formula (30), $R^{14}$ is an ethyl group ($C_2$ alkyl group), $R^{16}$ is a hydrogen atom and $R^{17}$ is a methylene group ($C_1$ alkylene group)], and processing it with isobutanol can yield butylated 1,3-bis(hydroxymethyl)-tetrahydro-2(1H)pyrimidinone [in the formula (30), $R^{14}$ is an isobutyl group ($C_4$ alkyl group), $R^{16}$ is a hydrogen atom and $R^{17}$ is a methylene group ($C_1$ alkylene group)].

Dimethyloluron represented by the formula (30) where $R^{14}$ and $R^{16}$ is a hydrogen atom and $R^{17}$ is an oxygen atom can be acquired by the reaction of urea with formaldehyde whose molecular amount is four times that of urea.

1,3-bis(hydroxymethyl)-tetrahydro-5-hydroxy-2(H) pyrimidinone where $R^{14}$ and $R^{16}$ are hydrogen atoms and $R^{17}$ is a hydroxymethylene group can be obtained by the reaction of urea with 2-hydroxypropyrenediamine and then the reaction of the resultant product with formaldehyde.

In the case of the compounds represented by the formula (31), for example, 1,3,4,6-tetrakis-(hydroxymethyl) glycoluril (also called "1,3,4,6-tetrakis(hydroxymethyl) acetyleneurea, tetramethylolated glyoxazolediurein) in which $R^{14}$ in the general formula (31) is a hydrogen atom and $R^{18}$ is a hydrogen atom can be obtained by the reaction of glyoxazole with urea whose molecular amount is twice that of glyoxazole and then by performing methylolation using formaldehyde.

The compounds in the formula (31) where $R^{14}$ is an alkyl group or oxoalkyl group and $R^{18}$ is a hydrogen atom can be obtained by processing 1,3,4,6-tetrakis(hydroxymethyl)-glycoluril with the associated alcohol. For example, processing 1,3,4,6-tetrakis(hydroxymethyl)glycoluril with methanol can yield 1,3,4,6-tetrakis(methoxymethyl) glycoluril [in the formula (31), $R^{14}$ is a methyl group ($C_1$ alkyl group) and $R^{18}$ is a hydrogen atom], processing it with ethanol can yield 1,3,4,6-tetrakis(ethoxymethyl)glycoluril [in the formula (31), $R^{14}$ is an ethyl group ($C_2$ alkyl group) and $R^{18}$ is a hydrogen atom], processing it with isobutanol can yield 1,3,4,6-tetrakis(isobutoxymethyl)glycoluril [in the formula (31), $R^{14}$ is an isobutyl group ($C_4$ alkyl group) and $R^{18}$ is a hydrogen atom], and processing it with 2-oxopropanol (also called "hydroxyacetone") can yield 1,3,4,6-tetrakis(β-oxopropoxymethyl)glycoluril [in the formula (30), $R^{14}$ is a β-oxopropyl group ($C_3$ oxoalkyl group) and $R^{18}$ is a hydrogen atom].

A preferable photoacid generator used in this invention should generate acid by irradiation of light of 180 nm to 220 nm and should be such that the mixture of this photoacid generator and the polymer in the above-described resist composition of the invention is dissolved sufficiently in an organic solvent and a film forming method like spin coating using this solution can form a uniform film coat. Further, a single photoacid generator may be used alone or in combination with one or more kinds of photoacid generators.

Some examples of usable photoacid generators are a sulfonium salt compound represented by the following formula (32), an iodonium salt compound represented by the following general formula (34), a succinimide derivative represented by the following general formula (35), a diazo compound represented by the following general formula (36), a 2,6-dinitrobenzyl ester group and a disulfon compound.

Their specific examples include a triphenylsulfonium salt derivative disclosed in Journal of the Organic Chemistry, vol. 43, no. 15, pp. 3055–3058 (1978) by J. V. Crivello et al., a diphenyliodonium salt derivative disclosed in Journal of the Polymer Science, vol. 56, pp. 383–395 (1976) by J. V. Crivello et al., an alkylsulfonium salt derivative such as cyclohexylmethyl(2-oxocyclohexyl)-sulfonium trifluoromethanesulfonate disclosed in Unexamined Japanese Patent Application KOKAI Publication No. H7-28237, and a sulfonium salt compound having a crosslinked cyclic alkyl group such as 1-oxocyclohexylmethyl(2-norbornyl) sulfonium trifluoromethanesufonate disclosed in Unexamined Japanese Patent Application KOKAI Publication No. H8-27102. Other examples include a succinimide derivative such as ester N-hydroxy-succinimidemethanesulfonate disclosed in Unexamined Japanese Patent Application KOKAI Publication Nos. H6-214391, H7-181678 and H7-295220, a 2,6-dinitrobenzyl ester group [Proceeding of SPIE, vol. 1262, p. 32 (1990) by O. Nalamasu et al.], 1,2,3-tri (methanesulfonyloxy)benzene [Proceeding of PME '89 by Takumi Ueno et al., Kodansya, pp. 413–424 (1990)] and a disulfon compound.

where $R^{19}$, $R^{20}$ and $R^{21}$ are independently an alkyl-substituted, halogen-substituted or unsubstituted aromatic group, an alicyclic alkyl group, a crosslinked cyclic hydrocarbon group, a 2-oxoalicyclic alkyl group or an alkyl group, $Y^-$ is $BF_4^-$, $AsF_6^-$, $SbF_6$ or an ion represented by the following formula (33),

where Z is $C_nF_{2n+1}$ (n is an integer from 1 to 6), an alkyl group or an alkyl-substituted, halogen-substituted or unsubstituted aromatic group,

where $R^{22}$ and $R^{23}$ are independently an alkyl-substituted, halogen-substituted or unsubstituted aromatic group, an alicyclic alkyl group, a crosslinked cyclic hydrocarbon group, a 2-oxoalicyclic alkyl group or an alkyl group, and $Y^-$ is the same as that in the formula (32),

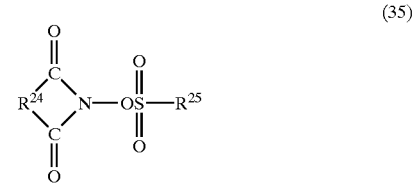

where $R^{24}$ is a halogen-substituted or unsubstituted alkylene group, an alkyl-substituted, halogen-substituted or unsubstituted dihydric aromatic group, and $R^{25}$ is a halogen-substituted or unsubstituted alkyl group, an alkyl group or a halogen-substituted or unsubstituted aromatic group, and

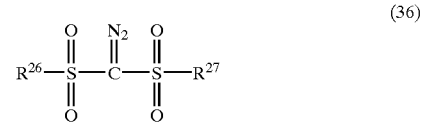

where $R^{26}$ and $R^{27}$ are independently a halogen-substituted or unsubstituted alkyl group, a halogen-substituted or unsubstituted aromatic group or an alicyclic hydrocarbon group.

When polyhydric alcohol (dihydric alcohol or more valences alcohol) is contained in the negative photoresist composition of this invention, the resolution is improved in some cases. This is because polyhydric alcohol which has a high reactivity to a crosslinking agent works as a crosslinking promotor.

Examples of polyhydric alcohol used as needed in this invention include ethylene glycol, glycerol, 1,2-butanediol, 1,3-butanediol, 1,4-butanediol, 2,3-butanediol, 1,2,4-butanetriol, 1,2-pentanediol, 1,4-pentanediol, 1,5-pentanediol, 2,4-pentanediol, 1,2-hexanediol, 1,5-hexanediol, 1,6-hexanediol, 2,5-hexanediol, 1,2-cyclohexanediol, 1,3-cyclohexanediol, 1,4-cyclohexanediol, 1,2-cyclohexanedimethanol, 1,4-cyclohexanedimethanol, 1,3,5-cyclohexanetrimethanol, 1,2-cyclopentanediol, 1,3-cyclopentanediol, 1,2-cyclooctanediol, 1,5-cyclooctanediol, tricyclodecandimethanol, 2,3-norbornanediol, 2(3)-hydroxy-5,6-bis(hydroxymethyl)norbornane, 2,3-dihydroxy-5(6)-hydroxymethylnorbornane, 1,4-anhydroerythriol, L-arabinose, L-arabitol, D-cellobiose, cellulose, 1,5-decalindiol, glucose, galactose, lactose, maltose, mannose and mannitol, though they are in no way restrictive.

The ratio of the content of the polymer having a diol structure in the negative photoresist composition of this invention is normally 50 to 98 parts by weight with respect to 100 parts by weight of the entire structural components including itself, and is preferably 70 to 95 parts by weight. When the ratio of this content is less than 50 parts by weight, it is difficult to form a uniform film. When the ratio of this content exceeds 98 parts by weight, the amounts of the crosslinking agent and photoacid generator to be introduced inevitably become smaller. This results in insufficient crosslinking, thus disabling pattern acquisition.

The ratio of the content of the crosslinking agent is normally 1 to 50 parts by weight with respect to 100 parts by weight of the entire structural components including itself, and is preferably 10 to 30 parts by weight. When the ratio of this content is less than 1 part by weight, sufficient crosslinking of the polymer does not occur, thus disabling pattern acquisition. When the ratio of this content exceeds 50 parts by weight, it is difficult to form a uniform film and the transparency of the thin film may lower. Further, the ratio of the polymer content is insufficient so that a sufficient etching resistance may not be obtained.

The ratio of the content of the photoacid generator is normally 0.2 to 15 parts by weight with respect to 100 parts by weight of the entire structural components including itself, and is preferably 0.5 to 10 parts by weight. When the ratio of this content is less than 0.2 part by weight, the sensitivity of the negative photoresist composition of this invention lowers significantly, making it difficult to form a pattern. When the ratio of this content exceeds 15 parts by weight, it becomes difficult to form a uniform film coat and the residual (scum) is likely to be produced after development.

In a case where polyhydric alcohol is contained in the negative photoresist composition, the amount of its content of 0.2 to 20 parts by weight with respect to 100 parts by weight of the entire structural components including itself is effective in improving the resolution.

There is no particular restriction on a solvent to be used in this invention as long as it is an organic solvent in which the negative photoresist composition is sufficiently dissolved and whose solution can provide a uniform film coat using a film forming method like spin coating. If the above conditions are satisfied, any kind of solvent can be used. Also, a single kind of solvent or more than 2kind of solvent may be used.

Specific examples of the solvent are n-propyl alcohol, isopropyl alcohol, n-butyl alcohol, tert-butyl alcohol, methyl cellsolve acetate, ethyl cellsolve acetate, propylene glycol monoethyl ether acetate(1-methoxy-2-acetoxypropane), methyl lactate, ethyl lactate, 2-methoxybutyl acetate, 2-ethoxyethyl acetate, methyl pyruvate, ethyl pyruvate, methyl 3-methoxypropionate, ethyl 3-methoxypropionate, N-methyl-2-pyrolidinone, cyclohexanone, cyclopentanone, cyclohexanol, methyl ethyl ketone, 1,4-dioxane, ethylene glycol monomethyl ether, ethylene glycol monomethyl ether acetate, ethylene glycol monoethyl ether, ethylene glycol monoisopropyl ether, diethylene glycol monomethyl ether, and diethylene glycol dimethyl ether, which are not however restrictive.

Another components such as surfactant, coloring matter, stabilizer, coating-property modifier or die may be added to the photoresist composition of this invention as needed.

The negative photoresist composition of this invention has, as the base resin, a polymer having an alicyclic alkyl group which is known to provide a high dry etching resistance. Since this polymer does not have a benzene ring, it has a high transparency to light of a short wavelength of 220 nm or shorter like the ArF excimer laser light.

As apparent from the above, the photoresist composition of this invention is a chemical sensitization type resist and has both a high transparency to light of a short wavelength of 220 nm or shorter like the ArF excimer laser light and a high dry etching resistance. This photoresist composition can therefore be used as a new negative photoresist material for use in fabrication of semiconductor devices.

4. Pattern Forming Method

This invention also provides a method of forming a negative pattern of a photoresist on a substrate to be processed by using the above-described negative photoresist composition.

Figure 1B:
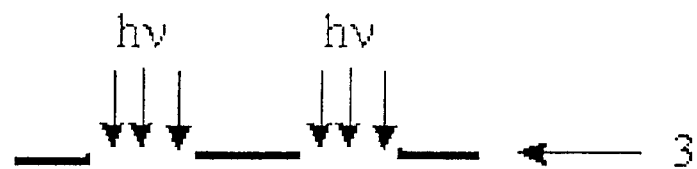
Figure 1B:
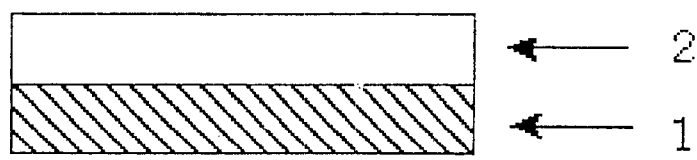
Figure 1C:
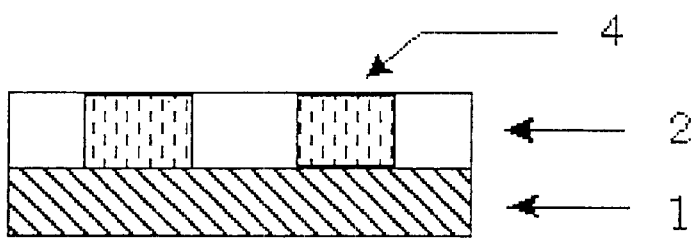
Figure 1D:
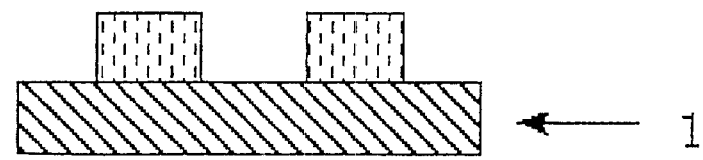

First, as shown in FIG. 1A, the negative photoresist material of this invention is applied on a substrate 1 to be processed, then pre-baking is performed at 60 to 170 degrees Celsius for 30 to 240 seconds using heating means like a hot plate, thereby forming a resist film 2. Then, the resist film 2 is selectively exposed by an exposure system using a photomask 3, as shown in FIG. 1B. After exposure, the resist film 2 is heated. Consequently, crosslinking of the resin occurs in an exposure area 4, as shown in FIG. 1C. Finally, the unexposed portion of the resist film 2 is selectively dissolved and removed by an alkaline developer like a tetramethylammoniumhydroxide (TMAH) solution, thereby forming a negative pattern as shown in FIG. 1D.

EXAMPLES

Examples of this invention will now be discussed, but it is to be noted that those examples are to be considered as illustrative and in no way restrictive.

Example 1

Synthesis of 3,4-Dihydroxytricyclo[$5.2.1.0^{2,6}$]-decyloxyethyl Acrylate

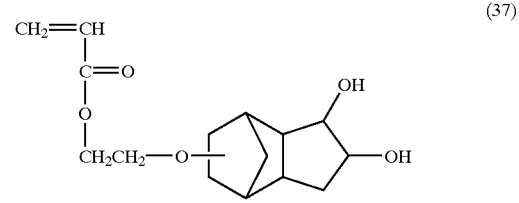

(37)

39.25 g of m-chloroperbenzoic acid was placed in a 500-ml three neck flask with a drying tube and was dissolved in 300 ml of chloroform, and the resultant solution was cooled in an ice bath. Then, 25 g (0.122 mol) of dicyclopentenyloxyethyl acrylate (FA-512A manufactured by Hitachi Chemical Co., Ltd.) was dropped in the liquid. After dropping, the resultant liquid was stirred for one hour under the ice cold environment and two hours at the room temperature. The precipitated m-chloroperbenzoic acid was filtered out, and the filtered liquid was cleaned in 300 ml of 10% sodium hydrogensulfite solution, 200 ml of 5% sodium carbonate solution and saturated salt solution in order. The solution was dried with magnesium sulfate, after which chloroform was left under reduced pressure. As a result, the double bond of the alicyclic group of dicyclopentenyloxyethyl acrylate was epoxidated, yielding 25 g of 3,4-epoxytricyclodecyloxyethyl acrylate (93% yield).

Then, 11 g (0.05 mol) of 3,4-epoxytricyclodecyloxy-ethyl acrylate was dissolved in 80 ml of tetrahydrofuran and iced. Then, 40 ml of a 35% perchloric acid solution was dropped in the liquid and was thereafter stirred for two hours at the room temperature. 200 ml ether was added to the reaction solution and was cleaned with 2% sodium hydroxide until the liquid layer became alkaline. Then, the resultant solution was cleaned with saturated salt solution after which the organic layer was dried with magnesium sulfate. The solvent was left under reduced pressure, and the residual was cleaned with 100 ml of hexane: acetate-ethyl blended solvent (5:1). Consequently, the epoxy group of 3,4-epoxytricyclodecyloxyethyl acrylate was ring-opened, yielding 5 g of 3,4-dihydroxytricyclodecyloxyethyl acrylate (viscous liquid, 67% yield).

$^1$H-NMR (CDCl$_3$): δ 0.85–2.50 (10H, m), 3.28–3.70 (7H, br), 4.2–4.35 (2H, m), 5.8 (1H, dd), 6.15 (1H, dd), 6.43 (1H, d); IR (cm$^{-1}$): 3400 (vOH), 2848, 2940 (vCH), 1720 (vC=O), 1618, 1625 (vC=C).

Example 2

Synthesis of 3,4-Dihydroxytricyclo[5.2.1.0$^{2,6}$)]-decyloxyethyl Methacrylate

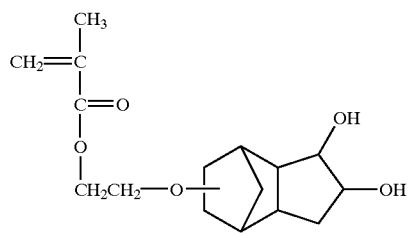

(38)

By using 30 g (0.115 mol) of dicyclopentenyloxyethyl methacrylate (a compound acquired in a synthesis example 1 to be discussed later) in place of dicyclopentenyloxyethyl acrylate and 34 g of m-chloroperbenzoic acid, the epoxidation reaction of dicyclopentenyloxyethyl methacrylate was carried out in the same way as used in the example 1. This yielded 30.2 g of 3,4-epoxytricyclo-decyloxyethyl methacrylate (95% yield).

Then, the ring opening reaction of the epoxy group was performed by using 40 ml of a 35% perchloric acid solution in the same way as done in the example 1 using 13.5 g (0.05 mol) of 3,4-epoxytricyclodecyloxyethyl methacrylate. This yielded 9.1 g of 3,4-dihydroxytricyclodecyl methacrylate (viscous liquid, 63% yield).

$^1$H-NMR (CDCl$_3$): δ 0.84–2.50 (12H, m), 3.28–3.70 (7H, br), 4.22–4.36 (2H, m), 5.58 (1H, dd), 6.14 (1H, dd); IR (cm$^{-1}$): 3400 (vOH), 2848, 2940 (vCH), 1720 (vC=O), 1618, 1625 (vC=C).

Example 3

Synthesis of 3,4-Dihydroxytricyclo[5.2.1.0$^{2,6}$]-decyloxypropyl Methacrylate

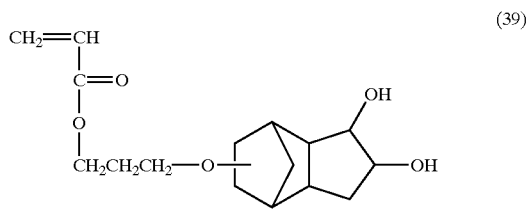

(39)

By using 30 g (0.11 mol) of dicyclopentenyloxypropyl acrylate in place of dicyclopentenyloxyethyl acrylate and 34 g of m-chloroperbenzoic acid, the epoxidation reaction of dicyclopentenyloxypropyl methacrylate was carried out in the same way as done in the example 1. This yielded 30.3 g of 3,4-epoxytricyclodecyloxypropyl acrylate (96% yield).

Then, the ring opening reaction of the epoxy group was performed by using 56 ml of a 35% perchloric acid solution in the same way as done in the example 1 using 20 g (0.069 mol) of 3,4-epoxytricyclodecyloxypropyl acrylate. This yielded 9.7 g of 3,4-dihydroxytricyclodecyloxypropyl acrylate (viscous liquid, 46% yield).

$^1$H-NMR (CDCl$_3$): δ 0.85–2.49 (12H, m), 3.28–3.70 (7H, br), 4.2–4.35 (2H, m), 5.81 (1H, dd), 6.15 (1H, dd), 6.43 (1H, d); IR (cm$^{-1}$): 3400 (vOH), 2848, 2940 (vCH), 1720 (vC=O), 1617, 1625 (vC=C).

Example 4

Synthesis of 3,4-Dihydroxytricyclo[5.2.1.0$^{2,6}$]-decyloxybutyl Acrylate

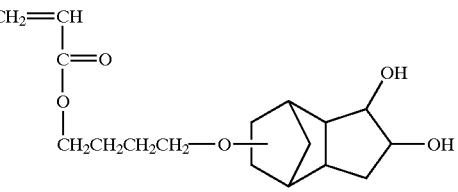

(40)

By using 30 g (0.108 mol) of dicyclopentenyloxybutyl acrylate in place of dicyclopentenyloxyethyl acrylate and 32 g of m-chloroperbenzoic acid, the epoxidation reaction of dicyclopentenyloxybutyl acrylate was carried out in the same way as done in the example 1. This yielded 29 g of 3,4-epoxytricyclodecyloxybutyl acrylate (92.7% yield).

Then, the ring opening reaction of the epoxy group was performed by using 40 ml of a 35% perchloric acid solution in the same way as done in the example 1 using 14.6 g (0.05 mol) of 3,4-epoxytricyclodecyloxybutyl acrylate. This yielded 9.52 g of 3,4-dihydroxytricyclodecyloxybutyl acrylate (viscous liquid, 61.2% yield).

$^1$H-NMR (CDCl$_3$): δ 0.85–2.49 (14H, m), 3.28–3.70 (7H, br), 4.2–4.35 (2H, m), 5.81 (1H, dd), 6.15 (1H, dd), 6.43 (1H, d); IR (cm$^{-1}$): 3400 (vOH), 2848, 2943 (vCH), 1720 (vC=O), 1617, 1625 (vC=C).

Example 5

Synthesis of Dihydroxypentacyclo-[6.5.1.1$^{3,6}$.0$^{2,7}$, 0$^{9,13}$]pentadecyloxyethyl Methacrylate

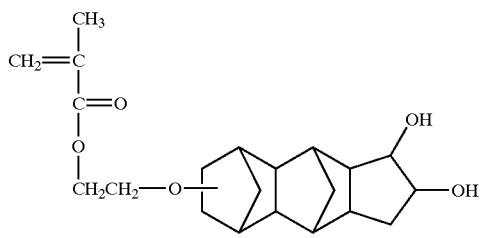

(41)

By using 10 g (0.03 mol) of pentacyclo-[6.5.1.1$^{3,6}$.0$^{2,7}$, 0$^{9,13}$]pentadecyloxyethyl methacrylatein in place m-chloroperbenzoic acid, the epoxidation reaction was carried out in the same way as used in the example 1. This yielded 8.9 g of epoxypentacyclo[6.5.1.1$^{3,6}$.0$^{2,7}$,0$^{9,13}$] pentadecyl-oxyethyl methacrylate (88% yield).

Then, the ring opening reaction of the epoxy group was performed by using 40 ml of a 35% perchloric acid solution in the same way as done in the example 1 using 8 g (0.05 mol) of epoxypentacyclo[6.5.1.1$^{3,6}$.0$^{2,7}$,0$^{9,13}$]pentadecyl-oxyethyl methacrylate. This yielded 4.9 g of 3,4-dihydroxypentacyclo[6.5.1.1$^{3,6}$.0$^{2,7}$,0$^{9,13}$] pentadecyloxyethyl methacrylate (viscous liquid, 58% yield).

$^{1}$H-NMR (CDCl$_3$): δ 0.84–2.50 (12H, m), 3.28–3.70 (7H, br), 4.22–4.36 (2H, m), 5.58 (1H, dd), 6.14 (1H, dd); IR (cm$^{-1}$): 3400 (vOH), 2848, 2940 (vCH), 1720 (vC=O), 1618, 1625 (vC=C).

Synthesis Example 1

Synthesis of Dicyclopentenyloxyethyl Methacrylate 25 g (0.128 mol) of a product acquired by adding ethylene glycol to dicyclopentenyloxyethanol (dicyclopentadien) in a 500-ml three neck flask using sulfuric acid as a solvent was dissolved in 200 ml tetrahydofuran and the resultant product was cooled in an ice bath. Then, 17.1 g of N,N-dimethylaniline was added to the product in which 14.8 g of methacrylate chloride was further dropped. The resultant product was sequentially cleaned with a sodium hydroxide solution, hydrochloric acid solution and saturated salt solution, and was then subjected to column refining with silica gel column (streaming solvent: blended solvent of hexane and ethyl acetate), thereby yielding dicyclopentenyloxyethyl methacrylate.

Example 6

Synthesis of a Polymer A1 Having the Following Structure

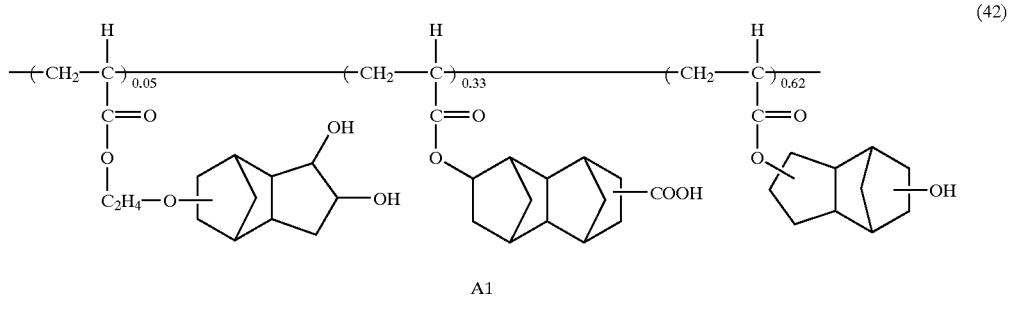

(42)

A1

0.52 g of 3,4-dihydroxytricyclo[5.2.1.0$^{2,6}$]decyloxy-ethyl acrylate, 3.31 g of carboxytetracyclo[4.4.0.1$^{2,5}$.1$^{7,1}$]-dodecyl acrylate and 5 g of hydroxytricyclodecyl acrylate were dissolved in 36 ml of dry tetrahydrofuran in a 100-ml flask with a reflux tube, 119 mg of azobisisobutyronitrile (AIBN) was added there and the resultant product was stirred at 60–65 degrees Celsius under the argon atmosphere. After two hours, the resultant product was cooled to the room temperature, 400 ml hexane/ether (4/1) was poured on the reaction mixture and the precipitate was filtered out. The resultant product was then subjected to reprecipitation refining, yielding 4.8 g of an intended product (54.4% yield). The copolymerization ratio then was 5:33:62 as obtained from the integration ratio of $^{1}$H-NMR. The molecular weight of the acquired resin A1 was 8300; this molecular weight was measured by gel permeation chromatography (GPC) using LC-9A manufactured by Shimadzu Corporation (column: KF-80M produced by Showa Denko K.K.) and obtained in terms of the molecular weight of polystyrene.

Example 7

A photoresist having the following composition was prepared. The following experiment was conducted under a yellow lamp.
(a) resin A1 (the one synthesized in the example 6) 3.7 g
(b) crosslinking agent B1 (shown below) 0.28 g
(c) photoacid generator C1 (triphenylsulfoniumtrifluoromethanesulfonate; shown below) 0.02 g
(d) diethylene glycol dimethyl ether 18.2 g

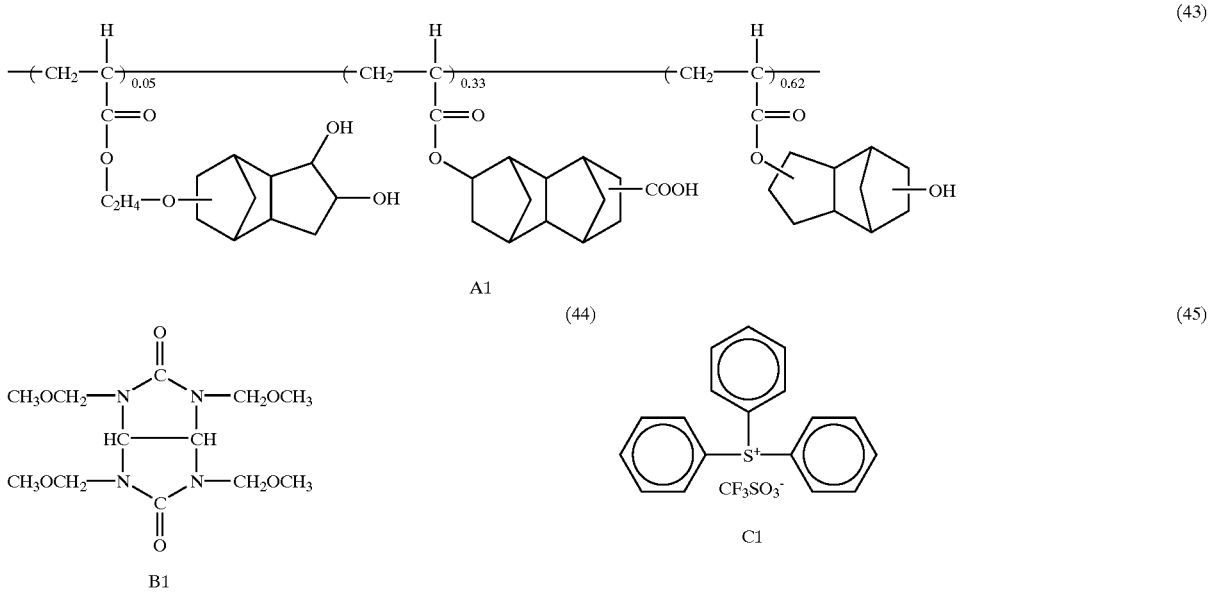

A1

(44)

(45)

B1

C1

The molecular weight of the resin A1 used was 8300; this molecular weight was measured by gel permeation chromatography (GPC) using LC-9A manufactured by Shimadzu Corporation (column: KF-80M produced by Showa Denko K.K.) and obtained in terms of the molecular weight of polystyrene.

The above mixture was filtered with a 0.2-micrometer tetronic filter to prepare the photoresist. This photoresist was spin-coated on a 3-in. quartz substrate, and the resultant structure was then heated at 120 degrees Celsius for 60 seconds on a hot plate, thus forming a thin film of 0.4 micrometers in thickness. The permeability of this thin film with respect to 193.4-nm light (the center wavelength of the ArF excimer laser light), which was measured by an ultraviolet spectrophotometer (UV365 manufactured by Shimadzu Corporation), was 68%. This is a sufficient transparency for a single-layer photoresist.

Example 8

The photoresist prepared in the example 7 was spin-coated on an 8-in. silicon substrate, and the resultant structure was then heated at 120 degrees Celsius for 60 seconds on a hot plate, thus forming a thin film of 0.4 micrometers in thickness. This thin film was exposed through a mask using a Nikon ArF excimer laser exposure system (NA=0.55). Immediately thereafter, the film was baked at 120 degrees Celsius for 60 seconds on a hot plate and was developed for 60 seconds by an immersion method using 2.38% TMAH solution of 23 degrees Celsius, after which the resultant product was rinsed with pure water. As a result, only the unexposed portions of the resist film were dissolved into the developer and removed and a negative pattern of 0.2 micrometers line and space (L/S) was acquired with the exposure amount of 6.4 mJ/cm$^2$. The obtained pattern did not show pattern stripping due to insufficient adhesion and deformation caused by swelling.

Example 9

A photoresist having the following composition was prepared. The following experiment was conducted under a yellow lamp.
(a) resin A1 (the one synthesized in the example 6) 6.84 g
(b) crosslinking agent B1 (the one described in the example 7) 0.56 g
(c) photoacid generator C1 (triphenylsulfoniumtrifluoromethanesulfonato; the one described in the example 7) 0.04 g
(d) polyhydric alcohol D1 (shown below) 0.56 g
(e) diethyleneglycol dimethyl ether 36.4 g The prepared photoresist was spin-coated on an 8-in. silicon substrate, and the resultant structure was then heated at 120 degrees Celsius for 60 seconds on a hot plate, thus forming a thin film of 0.4 micrometers in thickness. This thin film was exposed through a mask using a Nikon ArF excimer laser exposure system (NA=0.55). Immediately thereafter, the film was baked at 130 degrees Celsius for 60 seconds on a hot plate and was developed for 60 seconds by an immersion method using 2.38% TMAH solution of 23 degrees Celsius, after which the resultant product was rinsed with pure water. As a result, only the unexposed portions of the resist film were dissolved into the developer and removed and a negative pattern of 0.17 micrometers L/S was acquired with the exposure amount of 5.2 mJ/cm$^2$. The obtained pattern did not show pattern stripping due to insufficient adhesion and deformation caused by swelling.

(46)

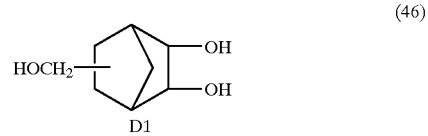

D1

Example 10

An exposure experiment was conducted in the same way as done for the example 9 except that the photoresist was prepared using 0.56 g of a crosslinking agent B2 (shown below) instead of the crosslinking agent B1. As a result, a negative pattern of 0.21 micrometers L/S was acquired with the exposure amount of 5.8 mJ/cm$^2$. The obtained pattern did not show pattern stripping due to insufficient adhesion and deformation caused by swelling.

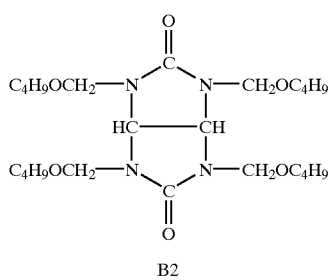

B2

Example 11

An exposure experiment was conducted in the same way as done for the example 9 except that the photoresist was prepared using 0.56 g of a crosslinking agent B3 (shown below) instead of the crosslinking agent B1. As a result, a negative pattern of 0.225 micrometers L/S was acquired with the exposure amount of 6.0 mJ/cm$^2$. The obtained pattern did not show pattern stripping due to insufficient adhesion and deformation caused by swelling.

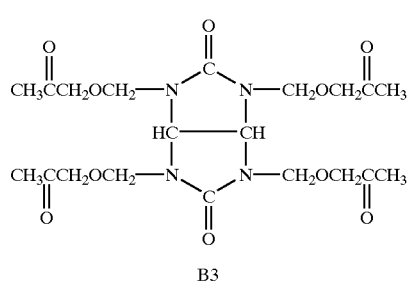

B3

Example 12

An exposure experiment was conducted in the same way as done for the example 9 except that the photoresist was prepared using a crosslinking agent B4 (shown below) instead of the crosslinking agent B1. As a result, a negative pattern of 0.3 micrometers US was acquired with the exposure amount of 12.8 mJ/cm$^2$. The obtained pattern did not show pattern stripping due to insufficient adhesion and deformation caused by swelling.

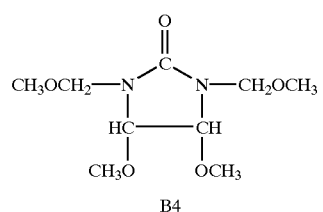

B4

Example 13

An exposure experiment was conducted in the same way as done for the example 9 except that the photoresist was prepared using a crosslinking agent B5 (shown below) instead of the crosslinking agent B1. As a result, a negative pattern of 0.35 micrometers L/S was acquired with the exposure amount of 13.6 mJ/cm$^2$. The obtained pattern did not show pattern stripping due to insufficient adhesion and deformation caused by swelling.

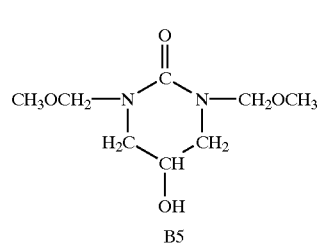

B5

Example 14

An exposure experiment was conducted in the same way as done for the example 9 except that the photoresist was prepared using a resin A2 (shown below) instead of the resin A1. The molecular weight of the resin A2 was 6200 (in terms of the molecular weight of polystyrene). The experiment yielded a negative pattern of 0.21 micrometers L/S with the exposure amount of 8.8 mJ/cm$^2$. The obtained pattern did not show pattern stripping due to insufficient adhesion and deformation caused by swelling.

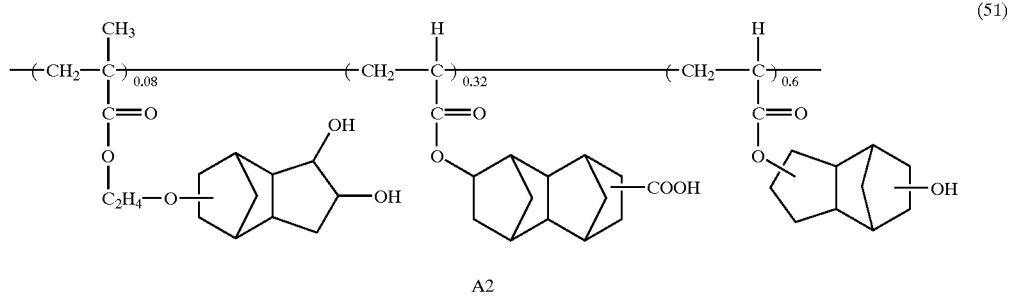

A2

Example 15

An exposure experiment was conducted in the same way as done for the example 9 except that the photoresist was prepared using a resin A3 (shown below) instead of the resin A1. The molecular weight of the resin A3 was 32500 (in terms of the molecular weight of polystyrene). In this experiment, 0.119 wt % of TMAH solution was used as a developer. The experiment yielded a negative pattern of 0.275 micrometers L/S with the exposure amount of 5.2 mJ/cm². The obtained pattern did not show pattern stripping due to insufficient adhesion and deformation caused by swelling.

show pattern stripping due to insufficient adhesion and deformation caused by swelling.

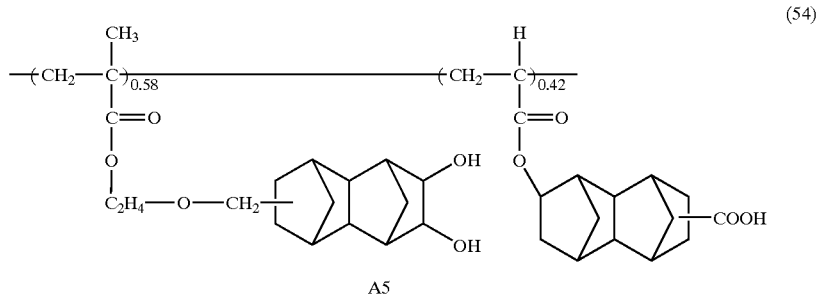

(54)

A5

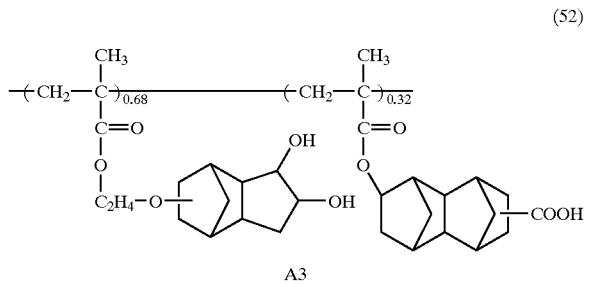

(52)

A3

Example 16

An exposure experiment was conducted in the same way as done for the example 9 except that the photoresist was prepared using a resin A4 (shown below) instead of the resin A1. The molecular weight of the resin A4 was 22000 (in terms of the molecular weight of polystyrene). The experiment yielded a negative pattern of 0.325 micrometers L/S with the exposure amount of 3.8 mJ/cm². The obtained pattern did not show pattern stripping due to insufficient adhesion and deformation caused by swelling.

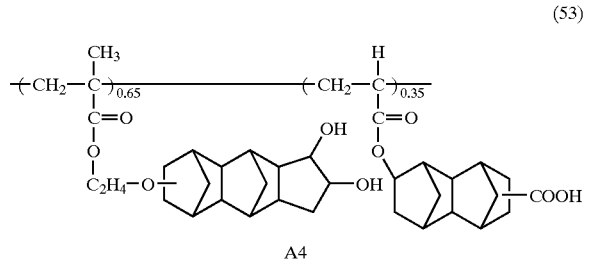

(53)

A4

Example 17

An exposure experiment was conducted in the same way as done for the example 9 except that the photoresist was prepared using a resin A5 (shown below) instead of the resin A1. The molecular weight of the resin A5 was 6100 (in terms of the molecular weight of polystyrene). The experiment yielded a negative pattern of 0.25 micrometers L/S with the exposure amount of 8 mJ/cm². The obtained pattern did not

Example 18

An exposure experiment was conducted in the same way as done for the example 9 except that the photoresist was prepared using a resin A6 (shown below) instead of the resin A1. The molecular weight of the resin A6 was 8200 (in terms of the molecular weight of polystyrene). In this experiment, 0.119 wt % of TMAH solution was used as a developer. The experiment yielded a negative pattern of 0.25 micrometers L/S with the exposure amount of 4.6 mJ/cm². The obtained pattern did not show pattern stripping dew to insufficient adhesion and deformation caused by swelling.

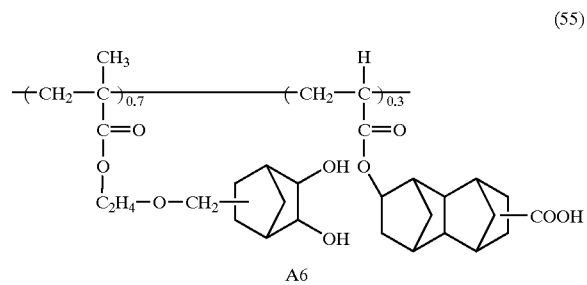

(55)

A6

Example 19

An exposure experiment was conducted in the same way as done for the example 9 except that the photoresist was prepared using a resin A7 (shown below) instead of the resin A1. The molecular weight of the resin A7 was 6400 (in terms of the molecular weight of polystyrene). The experiment yielded a negative pattern of 0.19 micrometers L/S with the exposure amount of 3.4 mJ/cm². The obtained pattern did not show pattern separation originated from deformation and insufficient adhesion caused by swelling.

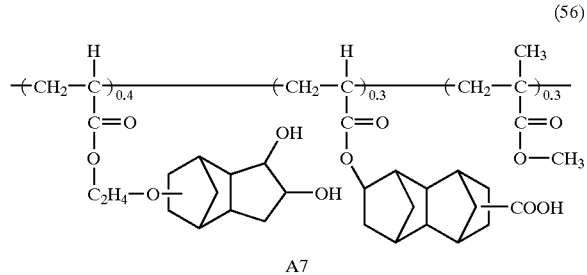

(56)

A7

Example 20

An exposure experiment was conducted in the same way as done for the example 9 except that the photoresist was prepared using a resin A8 (shown below) instead of the resin A1. The molecular weight of the resin A8 was 5500 (in terms of the molecular weight of polystyrene). The experiment yielded a negative pattern of 0.21 micrometers L/S with the exposure amount of 3.6 mJ/cm². The obtained pattern did not show pattern separation originated from deformation and insufficient adhesion caused by swelling.

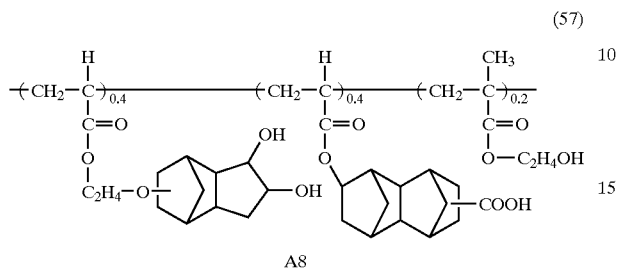

(57)

A8

Example 21

An exposure experiment was conducted in the same way as done for the example 9 except that the photoresist was prepared using a resin A9 (shown below) instead of the resin A1. The molecular weight of the resin A9 was 9500 (in terms of the molecular weight of polystyrene). The experiment yielded a negative pattern of 0.19 micrometers L/S with the exposure amount of 4.0 mJ/cm². The obtained pattern did not show pattern stripping due to insufficient adhesion and deformation caused by swelling.

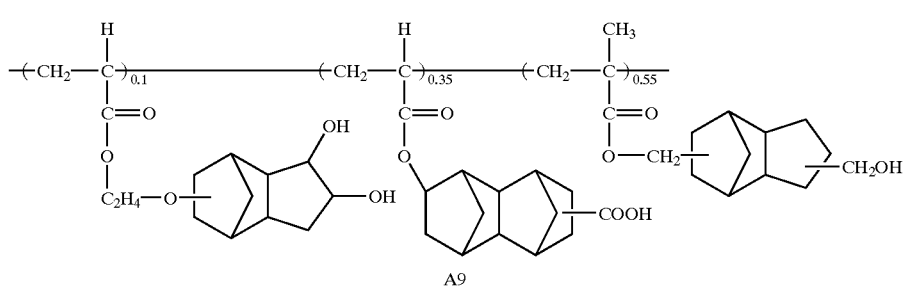

(58)

A9

Example 22

A photoresist having the following composition was prepared. The following experiment was conducted under a yellow lamp.
(a) resin A1 (the one synthesized in the example 6) 6.64 g
(b) crosslinking agent B1 (the one described in the example 7) 0.56 g
(c) photoacid generator C2 (β-oxocyclohexylmethyl (norbornyl)trifluoromethanesulfonate; shown below) 0.24 g
(d) polyhydric alcohol D1 (the one described in the example 9) 0.56 g
(e) diethylene glycol dimethyl ether 36.4 g The prepared photoresist was spin-coated on an 8-in. silicon substrate, and the resultant structure was then heated at 120 degrees Celsius for 60 seconds on a hot plate, thus forming a thin film of 0.4 micrometers in thickness. This thin film was exposed through a mask using a Nikon ArF excimer laser exposure system (NA=0.55). Immediately thereafter, the film was baked at 130 degrees Celsius for 60 seconds on a hot plate and was developed for 60 seconds by an immersion method using 2.38% TMAH solution of 23 degrees Celsius, after which the resultant product was rinsed with pure water. As a result, only the unexposed portions of the resist film were dissolved into the developer and removed and a negative pattern of 0.225 micrometers L/S was acquired with the exposure amount of 14.4 mJ/cm². The obtained pattern did not show pattern stripping due to insufficient adhesion and deformation caused by swelling.

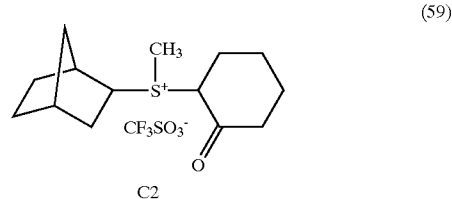

(59)

C2

Example 23

An exposure experiment was conducted in the same way as done for the example 9 except that the photoresist was prepared using a photoacid generator C3 (bis(tertiary butylphenyl)iodonium trifluoromethanesufonato; shown below) instead of the photoacid generator C1. As a result, a negative pattern of 0.19 micrometers L/S was acquired with the exposure amount of 10.2 mJ/cm². The obtained pattern did not show pattern stripping due to insufficient adhesion and deformation caused by swelling.

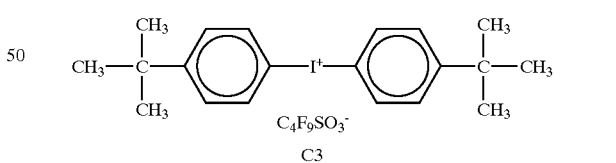

(60)

C3

Example 24

A photoresist having the following composition was prepared. The following experiment was conducted under a yellow lamp.
(a) resin A1 (the one synthesized in the example 6) 6.8 g
(b) crosslinking agent B1 (the one described in the example 7) 0.56 g
(c) photoacid generator C4 (N-hydroxyphthalimide-p-toluenesulfonic ester; shown below) 0.08 g
(d) polyhydric alcohol D1 (the one described in the example 9) 0.56 g (e) diethylene glycol dimethyl ether 36.4 g The prepared photoresist was spin-coated on an 8-in. silicon substrate, and the resultant structure was then heated at 120 degrees Celsius for 60 seconds on a hot plate, thus forming a thin film of 0.4 micrometers in thickness. This thin film was exposed through a mask using a Nikon ArF excimer laser exposure system (NA=0.55). Immediately thereafter, the film was baked at 150 degrees Celsius for 60 seconds on a hot plate and was developed for 60 seconds by an immersion method using 2.38% TMAH solution of 23 degrees Celsius, after which the resultant product was rinsed with pure water. As a result, only the unexposed portions of the resist film were dissolved into the developer and removed and a negative pattern of 0.30 micrometers L/S was acquired with the exposure amount of 7.2 mJ/cm². The obtained pattern did not show pattern stripping due to insufficient adhesion and deformation caused by swelling.

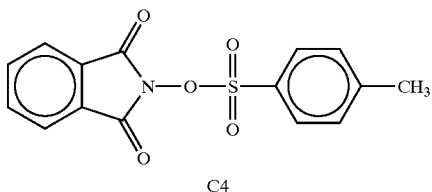

(61)

C4

Example 25

An exposure experiment was conducted in the same way as done for the example 24 except that the photoresist was prepared using a photoacid generator C5 (bisbenzensulfonyl-diazomethane; shown below) instead of the photoacid generator C4. Consequently, a negative pattern of 0.325 micrometers L/S was acquired with the exposure amount of 7.4 mJ/cm². The obtained pattern did not show pattern stripping due to insufficient adhesion and deformation caused by swelling.

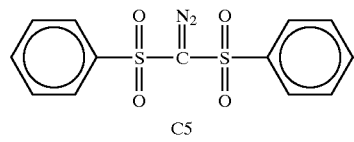

(62)

C5

Example 26

A photoresist having the following composition was prepared. The following experiment was conducted under a yellow lamp.
(a) resin A1 (the one synthesized in the example 6) 4.65 g
(b) crosslinking agent B1 (the one described in the example 7) 0.35 g
(c) diethylene glycol dimethyl ether 20 g The above mixture was filtered by a 0.2-micrometer tetronic filter to prepare the photoresist. This photoresist was spin-coated on a 4-in. silicon substrate, and the resultant structure was then baked at 100 degrees Celsius for 60 seconds on a hot plate, thus forming a thin film of 0.5 micrometers in thickness. The etching rate of this thin film with respect to $CF_4$ gas was measured by the reactive ion etching (RIE) apparatus DEM 451 manufactured by Anelva Corporation (etching conditions: power=100 W, pressure=5 Pa and gas flow rate=30 sccm). The results are shown in Table 3 below. Table 3 also shows the measuring results for a novolak resist (PFI-15A manufactured by Sumitomo Chemical Company, Limited), a film coat of poly(p-vinylphenol) used as the base resin for a KrF resist and a film coat of poly(methyl methacrylate) that is a resin having a molecular structure which does not even have a crosslinked cyclic hydrocarbon group as comparative examples. It is to be noted that the etching rate was standardized for the novolak resist.

The results showed that the photoresist of this invention has a slow etching rate with respect to $CF_4$ gas and an excellent dry etching resistance. This means that the photoresist of this invention has a high dry etching resistance.

Example 27

An etching rate experiment was conducted in the same way as done for the example 26 except that the photoresist was prepared using a resin A2 (the one synthesized in the example 10) instead of the resin A1. The results are shown in Table 3 below. The results showed that the photoresist of this invention has a slow etching rate with respect to $CF_4$ gas and an excellent dry etching resistance. This means that the photoresist of this invention has a high dry etching resistance.

TABLE 3

| | Etching rate (relative ratio) |
|---|---|
| Example 26 | 1.20 |
| Example 27 | 1.19 |
| Poly (methyl methacrylate) | 1.9 |
| Poly (p-vinylphenol) | 1.2 |
| Novolak resist (PFI-15A) | 1 |

This application is based on Japanese Patent Applications Nos. H10-312171 filed on Nov. 2, 1998 and H11-087403 filed on Mar. 30, 1999, which are incorporated herein by reference in its entirety.

What is claimed is:

1. A negative photoresist composition containing a polymer having a diol structure having a repeating unit represented by the following formula (6):

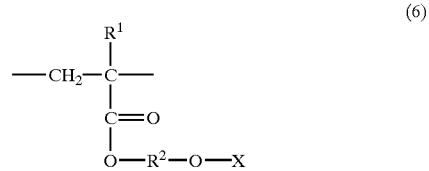

(6)

where $R^1$ is a hydrogen atom or methyl group, $R^2$ is a $C_2$–$C_6$ alkylene group and X is an alicyclic alkyl group having a diol structure, a crosslinking agent comprised of a compound containing a functional group represented by a following formula (12) and a photoacid generator which generates acid by exposure:

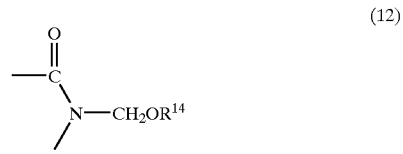

(12)

where $R^{14}$ is a hydrogen atom, a $C_1$–$C_6$ alkyl group or a $C_3$–$C_6$ oxoalkyl group.

2. A negative photoresist composition containing a polymer having a diol structure having a repeating unit represented by the following formula (6):

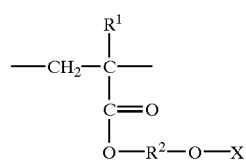
(6)

where $R^1$ is a hydrogen atom or methyl group, $R^2$ is a $C_2$–$C_6$ alkylene group and X is an alicyclic alkyl group having a diol structure, represented by the following formula (7), (8), (9), or (10)

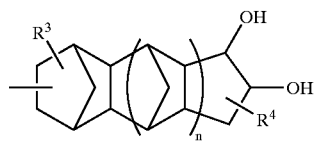
(7)

where n is an integer from 0 to 3, $R^3$ and $R^4$ are a hydrogen atom or methyl group,

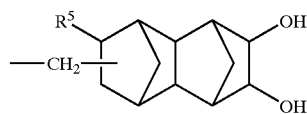
(8)

where $R^5$ is a hydrogen atom or methyl group,

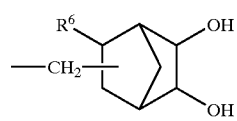
(9)

where $R^6$ is a hydrogen atom or methyl group, or

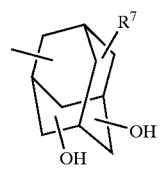
(10)

where $R^7$ is a hydrogen atom or methyl group, a crosslinking agent comprised of a compound containing a functional group represented by the formula (12)

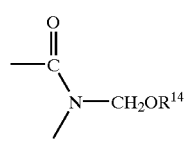
(12)

where $R^{14}$ is a hydrogen atom, a $C_1$–$C_8$ alkyl group or a $C_3$–$C_8$ oxoalkyl group and a photoacid generator which generates acid by exposure.

3. A negative photoresist composition containing a polymer having a diol structure represented by a following formula (11) and a weight average molecular weight of 1,000 to 50,000:

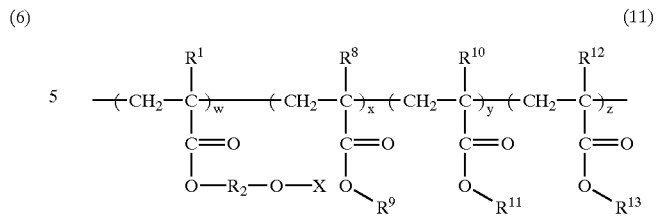
(11)

where $R^1$ and $R^2$ are the same as those in said formula (6), X is the same as that in any of said formulae (6) to (10), $R^8$ is a hydrogen atom or methyl group, $R^9$ is a $C_7$–$C_{18}$ crosslinked cyclic hydrocarbon group having a carboxyl group, $R^{10}$ is a hydrogen atom or methyl group, $R^{11}$ is a $C_7$–$C_{13}$ hydrocarbon group having a hydroxyl group, $R^{12}$ is a hydrogen atom or methyl group, $R^{13}$ is a hydrogen atom or a $C_1$–$C_{12}$ hydrocarbon group having a hydroxyl group, and w, x, y and z are arbitrary values satisfying, w+x+y+z=1,0<w≦1,0≦x<1,0≦y<1 and 0≦z<1, a crosslinking agent comprised of a compound containing a functional group represented by the formula (12)

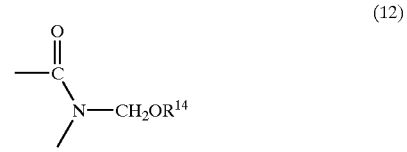
(12)

where $R^{14}$ is a hydrogen atom, a $C_1$–$C_8$ alkkyl group or a $C_3$–$C_8$ oxoalkyl group and a photoacid generator which generates acid by exposure.

4. A negative photoresist composition contaning a polymer having a diol structure represented by a following formula (11) and a weight average molecular weight of 1,000 to 50,000:

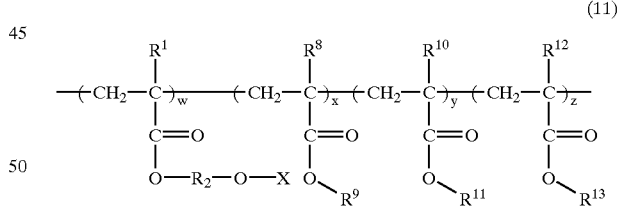
(11)

where R1 and R2 are the same as those in said formula (6), X is the same as that in any of said formulae (6) to (10), $R^8$ is a hydrogen atom or methyl group, $R^9$ is a $C_7$–$C_{18}$ crosslinked cyclic hydrocarbon group having a carboxyl group, $R^{10}$ is a hydrogen atom or methyl group, $R^{11}$ is a $C_7$–$C_{13}$ hydrocarbon group having a hydroxyl group, $R^{12}$ is a hydrogen atom or methyl group, $R^{13}$ is a hydrogen atom or a $C_1$–$C_{12}$ hydrocarbon group having a hydroxyl group, and w, x, y and z are arbitrary values satisfying, w+x+y+z=1,0 <w≦1,0≦x<1,0≦y<1 and 0≦z<1, a crosslinking agent comprised of a compound containing a functional group represented by formula (12)

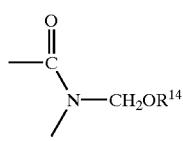

(12)

where R14 is a hydrogen atom, a C1–C6 alkyl group or a C3–C6 oxoalkkyl group, and a photoacid generator which generates acid by exposure.

5. The negative photoresist composition according to claim 1, further containing a polyhydric alcohol compound.

6. The negative photoresist composition according to claim 2, further containing a polyhydric alcohol compound.

7. The negative photoresist composition according to claim 3, further containing a polyhydric alcohol compound.

8. The negative photoresist composition according to claim 4, further containing a polyhydric alcohol compound.

9. The negative photoresist composition according to claim 1, wherein said crosslinking agent is at least one of compounds represented by following formulae (13) to (17):

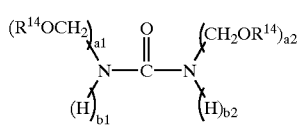

(13)

where $R^{14}$ is the same as that in said formula (12), $a_1$ is 1 or 2, $a_2$ is 1 or 2, $b_1$ is 0 or 1, $b_2$ is 0 or 1, $a_1+b_1=2$ and $a_2+b_2=2$,

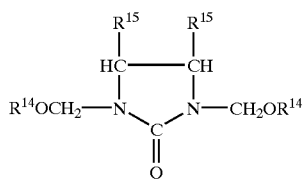

(14)

where $R^{14}$ is the same as that in said formula (12), $R^{15}$ is a hydrogen atom, a hydroxyl group, a $C_1$–$C_6$ alkoxy group or a $C_3$–$C_6$ oxoalkyloxy group,

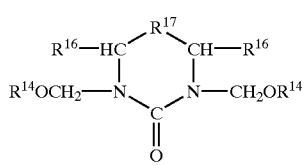

(15)

where $R^{14}$ is the same as that in said formula (12), $R^{16}$ is a hydrogen atom, a hydroxyl group, a $C_1$–$C_6$ alkoxy group or a $C_3$–$C_6$ oxoalkyloxy group, and $R^{17}$ is an oxygen atom, a sulfur atom, $C_1$–$C_3$ alkylene group or a hydroxymethylene group,

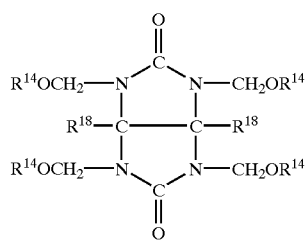

(16)

where $R^{14}$ is the same as that in said formula (12), $R^{18}$ is a hydrogen atom or a methyl group, and

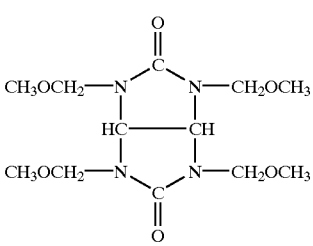

(17)

10. The negative photoresist composition according to claim 2, wherein said crosslinking agent is at least one of compounds represented by said formulae (13) to (17).

11. The negative photoresist composition according to claim 3, wherein said crosslinking agent is at least one of compounds represented by said formulae (13) to (17).

12. The negative photoresist composition according to claim 4, wherein said crosslinking agent is at least one of compounds represented by said formulae (13) to (17).

13. The negative photoresist composition according to claim 5, wherein said crosslinking agent is at least one of compounds represented by said formulae (13) to (17).

14. The negative photoresist composition according to claim 6, wherein said crosslinking agent is at least one of compounds represented by said formulae (13) to (17).

15. The negative photoresist composition according to claim 7, wherein said crosslinking agent is at least one of compounds represented by said formulae (13) to (17).

16. The negative photoresist composition according to claim 8, wherein said crosslinking agent is at least one of compounds represented by said formulae (13) to (17).

17. The negative photoresist composition according to claim 1, wherein said photoacid generator is at least one of a sulfonium salt compound represented by a following formula (18), an iodonium salt compound represented by a following formula (20), an imide compound represented by a following formula (21) and a diazo compound represented by a following formula (22):

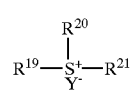

(18)

where $R^{19}$, $R^{20}$ and $R^{21}$ are independently an alkyl-substituted, halogen-substituted or unsubstituted aromatic group, an alicyclic alkyl group, a crosslinked cyclic hydrocarbon group, a 2-oxoalicyclic alkyl group or an alkyl group, $Y^-$ is $BF_4^-$, $AsF_6^-$; $SbF_6^-$ or an ion represented by a following formula (19),

(19)

where Z is $C_nF_{2n+1}$ (n is an integer from 1 to 6), an alkyl group or an alkyl-substituted, halogen-substituted or unsubstituted aromatic group,

(20)

where $R^{22}$ and $R^{23}$ are independently an alkyl-substituted, halogen-substituted or unsubstituted aromatic group, an alicyclic alkyl group, a crosslinked cyclic hydrocarbon group, a 2-oxoalicyclic alkyl group or an alkyl group, and $Y^-$ is the same as that in said formula (18),

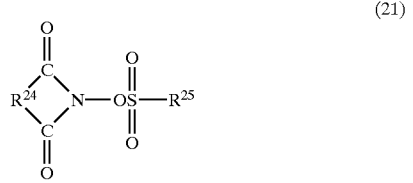
(21)

where $R^{24}$ is a halogen-substituted or unsubstituted alkylene group, an alkyl-substituted, halogen-substituted or unsubstituted dihydric aromatic group, and $R^{25}$ is a halogen-substituted or unsubstituted alkyl group, an alkyl group or a halogen-substituted or unsubstituted aromatic group, and

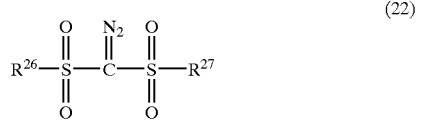
(22)

where $R^{26}$ and $R^{27}$ are independently a halogen-substituted or unsubstituted alkyl group, a halogen-substituted or unsubstituted aromatic group or an alicyclic hydrocarbon group.

18. The negative photoresist composition according to claim 2, wherein said photoacid generator is at least one of a sulfonium salt compound represented by said formula (18), an iodonium salt compound represented by said formula (20), an imide compound represented by said formula (21) and a diazo compound represented by said formula (22).

19. The negative photoresist composition according to claim 3, wherein said photoacid generator is at least one of a sulfonium salt compound represented by said formula (18), an iodonium salt compound represented by said formula (20), an imide compound represented by said formula (21) and a diazo compound represented by said formula (22).

20. The negative photoresist composition according to claim 14, wherein said photoacid generator is at least one of a sulfonium salt compound represented by said formula (18), an iodonium salt compound represented by said formula (20), an imide compound represented by said formula (21) and a diazo compound represented by said formula (22).

21. The negative photoresist composition according to claim 5, wherein said photoacid generator is at least one of a sulfonium salt compound represented by said formula (18), an iodonium salt compound represented by said formula (20), an imide compound represented by said formula (21) and a diazo compound represented by said formula (22).

22. The negative photoresist composition according to claim 6, wherein said photoacid generator is at least one of a sulfonium salt compound represented by said formula (18), an iodonium salt compound represented by said formula (20), an imide compound represented by said formula (21) and a diazo compound represented by said formula (22).

23. The negative photoresist composition according to claim 7, wherein said photoacid generator is at least one of a sulfonium salt compound represented by said formula (18), an iodonium salt compound represented by said formula (20), an imide compound represented by said formula (21) and a diazo compound represented by said formula (22).

24. The negative photoresist composition according to claim 8, wherein said photoacid generator is at least one of a sulfonium salt compound represented by said formula (18), an iodonium salt compound represented by said formula (20), an imide compound represented by said formula (21) and a diazo compound represented by said formula (22).

25. The negative photoresist composition according to claim 9, wherein said photoacid generator is at least one of a sulfonium salt compound represented by said formula (18), an iodonium salt compound represented by said formula (20), an imide compound represented by said formula (21) and a diazo compound represented by said formula (22).

26. The negative photoresist composition according to claim 10, wherein said photoacid generator is at least one of a sulfonium salt compound represented by said formula (18), an iodonium salt compound represented by said formula (20), an imide compound represented by said formula (21) and a diazo compound represented by said formula (22).

27. The negative photoresist composition according to claim 11, wherein said photoacid generator is at least one of a sulfonium salt compound represented by said formula (18), an iodonium salt compound represented by said formula (20), an imide compound represented by said formula (21) and a diazo compound represented by said formula (22).

28. The negative photoresist composition according to claim 12, wherein said photoacid generator is at least one of a sulfonium salt compound represented by said formula (18), an iodonium salt compound represented by said formula (20), an imide compound represented by said formula (21) and a diazo compound represented by said formula (22).

29. The negative photoresist composition according to claim 1, wherein said negative photoresist composition contains 50 to 98 parts by weight of said polymer, 1 to 50 parts by weight of said crosslinking agent and 0.2 to 15 parts by weight of said photoacid generator.

30. The negative photoresist composition according to claim 2, wherein said negative photoresist composition contains 50 to 98 parts by weight of said polymer, 1 to 50 parts by weight of said crosslinking agent and 0.2 to 15 parts by weight of said photoacid generator.

31. The negative photoresist composition according to claim 3, wherein said negative photoresist composition contains 50 to 98 parts by weight of said polymer, 1 to 50 parts by weight of said crosslinking agent and 0.2 to 15 parts by weight of said photoacid generator.

32. The negative photoresist composition according to claim 4, wherein said negative photoresist composition contains 50 to 98 parts by weight of said polymer, 1 to 50 parts by weight of said crosslinking agent and 0.2 to 15 parts by weight of said photoacid generator.

* * * * *